(12) United States Patent
Kim et al.

(10) Patent No.: US 11,133,227 B2
(45) Date of Patent: Sep. 28, 2021

(54) SEMICONDUCTOR DEVICE HAVING ACTIVE REGION AND METHOD FOR FABRICATING THE SAME

(71) Applicant: XIA TAI XIN SEMICONDUCTOR (QING DAO) LTD., Qingdao (CN)

(72) Inventors: Deok-Yong Kim, Singapore (SG); Yongchul Oh, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/679,331

(22) Filed: Nov. 11, 2019

(65) Prior Publication Data

US 2020/0219776 A1     Jul. 9, 2020

Related U.S. Application Data

(60) Provisional application No. 62/782,366, filed on Dec. 20, 2018.

(51) Int. Cl.
| | |
|---|---|
| *H01L 21/8238* | (2006.01) |
| *H01L 21/28* | (2006.01) |
| *H01L 27/092* | (2006.01) |
| *H01L 29/66* | (2006.01) |
| *H01L 29/10* | (2006.01) |
| *H01L 29/72* | (2006.01) |

(52) U.S. Cl.
CPC ............... *H01L 21/823842* (2013.01); *H01L 21/28026* (2013.01); *H01L 21/823814* (2013.01); *H01L 21/823864* (2013.01); *H01L 21/823892* (2013.01); *H01L 27/092* (2013.01); *H01L 29/66575* (2013.01)

(58) Field of Classification Search
CPC ............. H01L 27/10894; H01L 27/092; H01L 27/0928; H01L 27/1116; H01L 21/426; H01L 21/266; H01L 21/0465; H01L 21/0415; H01L 21/2253; H01L 21/265; H01L 21/2652; H01L 21/823892; H01L 21/823814; H01L 21/823842; H01L 21/32155
See application file for complete search history.

(56) References Cited

U.S. PATENT DOCUMENTS

| | | | | |
|---|---|---|---|---|
| 2002/0187596 | A1* | 12/2002 | Yamanaka | ...... H01L 21/823807 438/197 |
| 2008/0160707 | A1* | 7/2008 | Jung | ............... H01L 21/823878 438/297 |

(Continued)

*Primary Examiner* — Sonya McCall-Shepard
(74) *Attorney, Agent, or Firm* — ScienBiziP, P.C.

(57) ABSTRACT

The instant disclosure discloses a method comprises receiving a substrate having a first region and a second region defined thereon and an insulating structure formed therebetween; forming, extending across the first region and the second region, a gate stack including a dielectric layer and a gate poly layer formed thereon; forming a first well mask covering the second region while defining a first opening that projectively overlaps the first region to partially exposes the gate poly layer; performing a first doping process, through the first opening and the gate stack, to form a first well in the substrate beneath the first opening; and performing a second doping process through the first opening to form a first gate conductor in the gate poly layer.

7 Claims, 23 Drawing Sheets

(56) References Cited

U.S. PATENT DOCUMENTS

2011/0175173 A1* 7/2011 Takebuchi ...... H01L 21/823892
257/371
2015/0115367 A1* 4/2015 Lin ................... H01L 21/26513
257/369

* cited by examiner

SEMICONDUCTOR DEVICE HAVING ACTIVE REGION AND METHOD FOR FABRICATING THE SAME

CROSS-REFERENCE TO RELATED APPLICATIONS

This application claims the benefit of U.S. Provisional Patent Application No. 62/782,366 filed on Dec. 20, 2018, which is hereby incorporated by reference herein and made a part of specification.

FIELD

The present disclosure generally relates to integrated circuit fabrication, more specifically to a process for defining active regions in complementary metal oxide semiconductor ("CMOS") transistors.

BACKGROUND

Modern integrated circuits (IC) are designed to encompass millions of components such as transistors, capacitors, resistors with high device density. IC are produced according to a series of complex fabrication steps including deposition, masking, etching and doping processes. For example, for memory circuits or devices, such as dynamic random access memories (DRAMs), static random access memories (SRAMs) and ferroelectric (FE) memories, the fabrication of the CMOS logic around the periphery traditionally comprises a number of relatively time-consuming and expensive masking steps.

There is a need, therefore, for a less complex manufacturing technique that would use fewer masks, and that would also provide improved yield in comparison to conventional techniques.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1A:
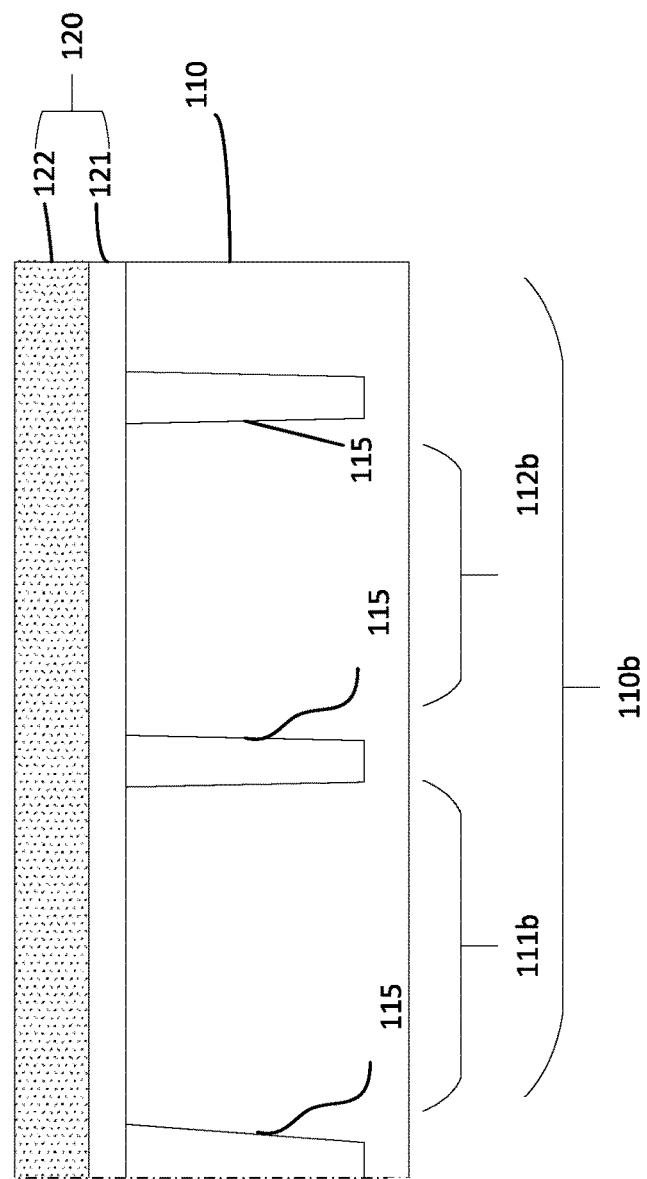
FIG. 1A-1L illustrate cross-sectional view of intermediate stages of fabricating an exemplary semiconductor device in accordance with some embodiments of the instant disclosure.
Figure 1A:
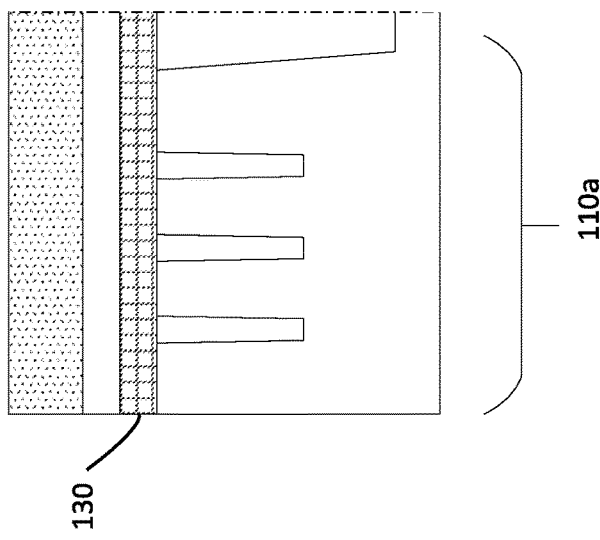

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 3. Reference will be made to the drawing figures to describe the present disclosure in detail, wherein depicted elements are not necessarily shown to scale and wherein like or similar elements are designated by same or similar reference numeral through the several views and same or similar terminology.

FIGS. 1A-1L illustrate regional cross-sectional view of intermediate stages of fabrication of semiconductor device in accordance with the instant disclosure. For illustrational simplicity and clarity, some detail/sub components of the exemplary device are not explicitly labeled in the instant figure. In some embodiment, the semiconductor device may be a CMOS.

When fabricating a semiconductor device, a semiconductor substrate is received for forming multiple layers of integrated circuit devices and features formed thereon. The substrate may comprise crystalline silicon for being doped to form various doped regions depending on design requirements (e.g., p-type substrate or n-type substrate). In some alternative embodiments, the substrate may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a silicon-on-insulator (SOI) structure, such as a silicon-on-insulator (SOI) structure, SiGe-on insulator (SiGeOI), Ge on insulator (GeOI) and the like.

Several functional regions may be arranged laterally (e.g., horizontally across the page as shown in FIG. 1) over a substrate. By way of example, FIG. 1A shows a substrate 110 of an exemplary device that includes two co-planar arranged functional regions defined thereon, e.g., a cell region 110a and a periphery region 110b.

Several regions may be defined in the periphery region 110b. For example, a first region 111b and a second region 112b in the periphery region 110b are defined by insulating structures 115. In the illustrated embodiment, insulating structures 115 are formed by local oxidation of silicon (LOCOS) process or a trench isolation process.

In the illustrated embodiment, a gate stack 120 is disposed over the substrate. The gate stack 120 extends across the first region 111b and the second region 112b. The gate stack 120 includes, form bottom to top, a dielectric layer 121 and a gate poly layer 122.

In the illustrated embodiment, before the formation of the gate stack 120, an interlayer dielectric layer 130 covering the cell region 110b may be optionally formed.

Figure 1B:
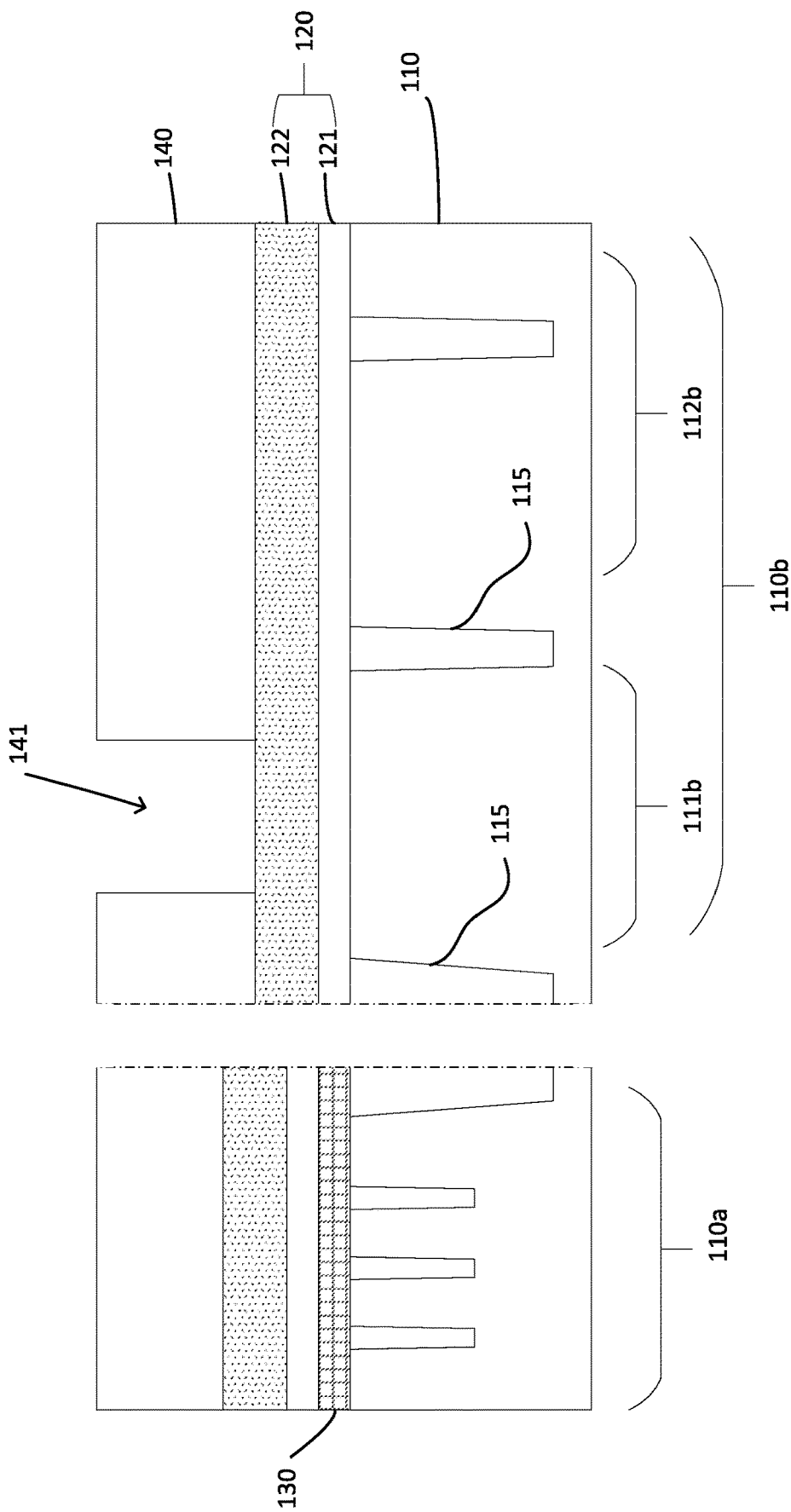

Referring to FIG. 1B, a first well mask 140 is formed to cover the second region 112b while defining a first opening 141. A portion of the gate poly layer 122 (that projectively overlaps the first region 111b) is exposed form the first well mask 140 through the first opening 141.

Figure 1C:
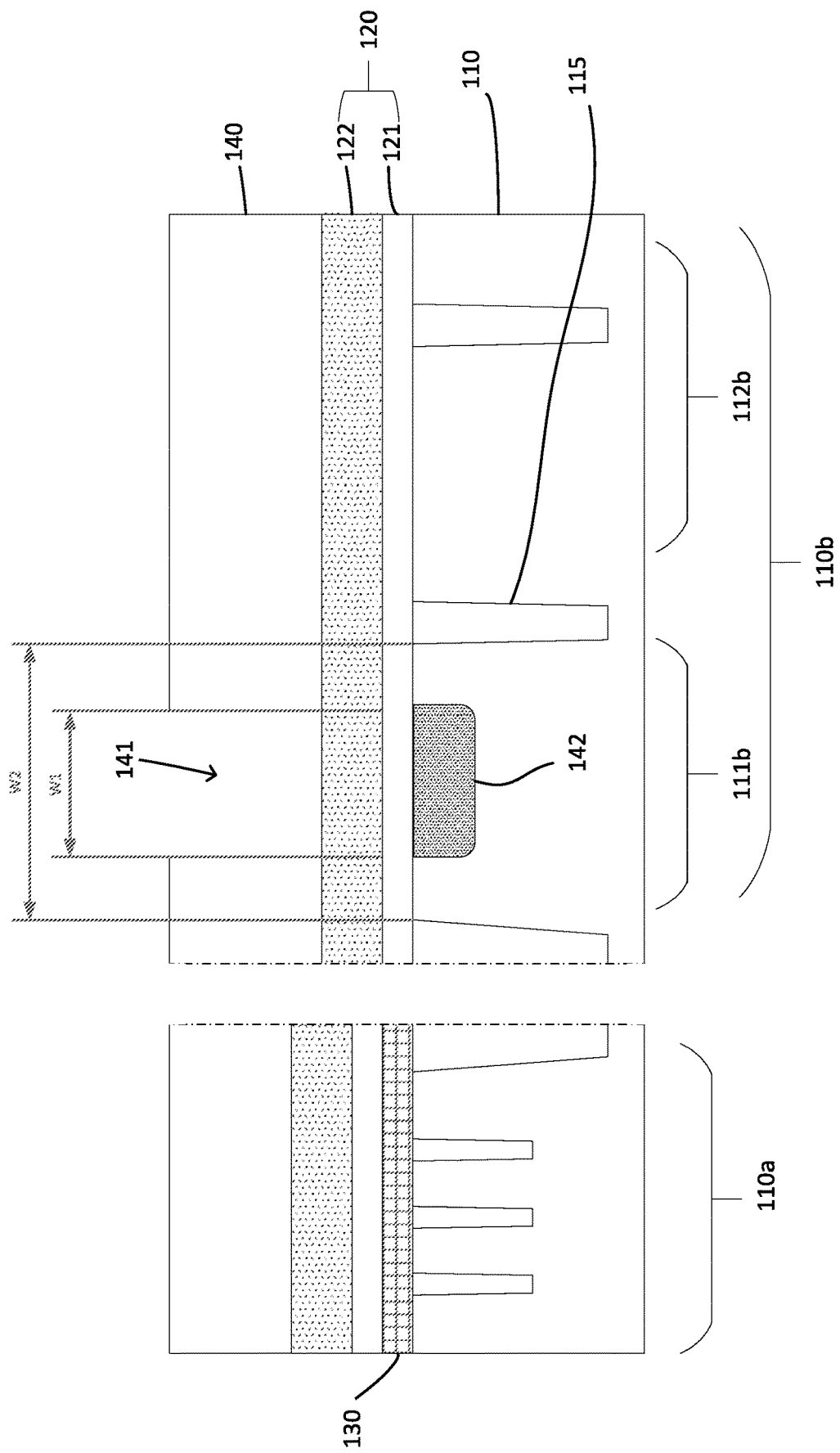

Referring to FIG. 1C, a first doping process is performed through the first opening 141 to form a first well 142. The first doping process may be performed using ion implantation technique. In the illustrated embodiment, during the first doping process, dopant of a first species (also referred as to impurity of a first species) penetrate the gate stack 120 and arrive at the substrate 110 to form the first well 142.

As each implanted ion (dopant) penetrates a target (e.g., the gate stack 120 and the substrate 110), its energy is lost due to obstacles in its travel path until it finally stops at some depth. Due to random energy loss, implanted ions may stop at different depths within the target, thereby leading to a distribution of the implanted ions about the depth of the target. In the illustrated embodiment where the implant power for the first doping process is set for accelerating the dopant of first species to penetrate the gate stack 120 through the first opening 141, the dopant of the first species are distributed in a portion of the dielectric layer 121 as well as in a portion (e.g., the first gate conductor 143 shown in FIG. 1D) of the gate poly layer 122 that overlaps with the first opening 141. In some scenarios, the dopant concentration of the first species in the first well 142 is greater than that in the gate stack 120.

The dopant of the first species may be p-type dopant, such as boron or BF2; or n-type dopant, such as phosphorus or arsenic.

In the illustrated embodiment, the first opening 141 defined by the first well mask 140 is narrower than the first region 111b, a lateral span $W_1$ of the first well 142 is narrower than (the width $W_2$ of) the first region 111b. In some embodiments, a width of the first opening may be defined substantially equal to that of the first region 111b, thereby the lateral span $W_1$ is about the same as the width $W_2$.

Figure 1D:
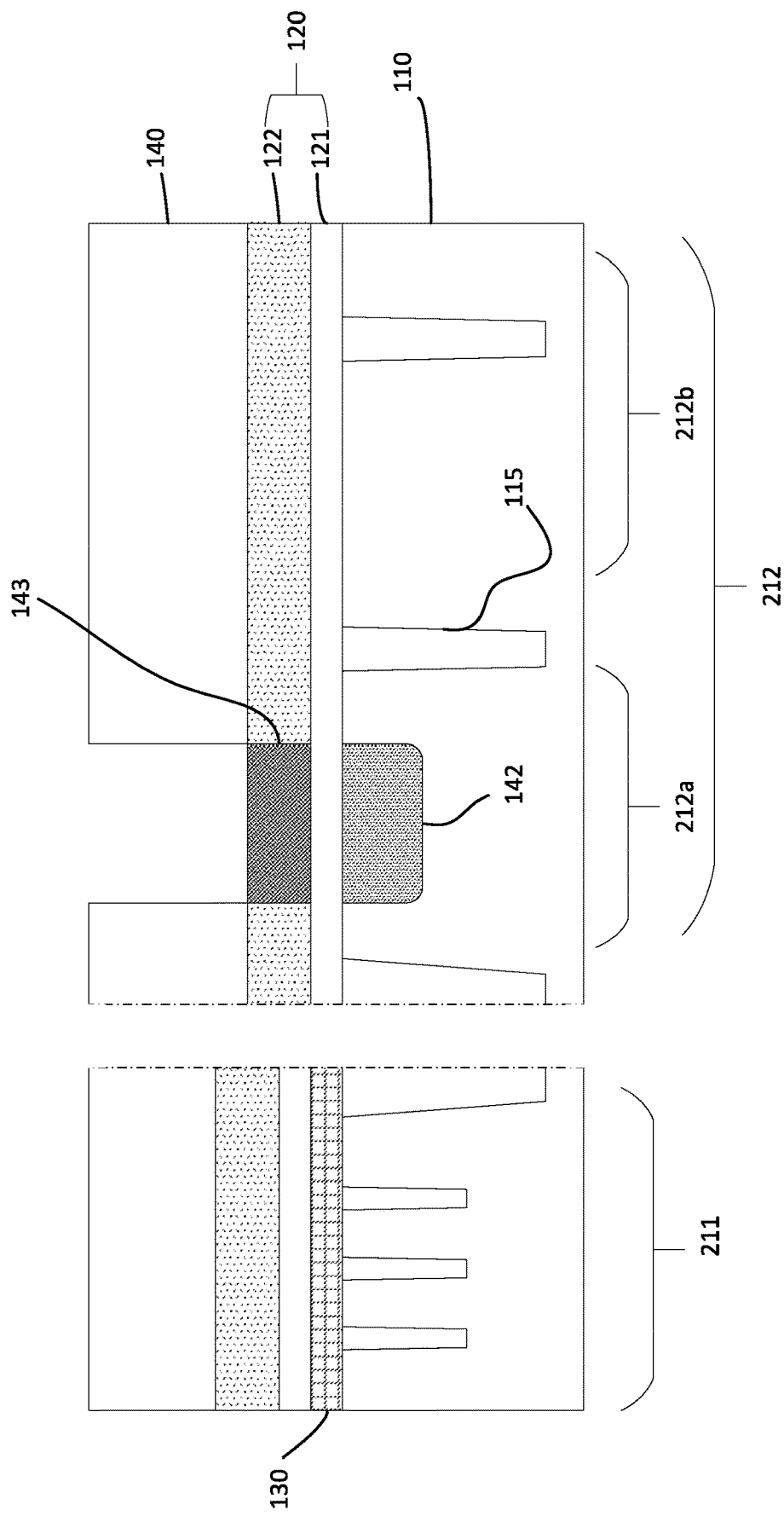

Referring to FIG. 1D, a second doping process is performed via the first well mask 140 to form a first gate conductor 143. The second doping process may be performed using ion implantation technique. In the illustrated embodiment, during the second doping process, dopant of a second species arrive the gate poly layer 122 of the gate stack 120. In the illustrated embodiment, the first gate conductor 143 may comprise not only the dopant of the second species, but also the dopant of the first species from the previously described first doping process. When the first species is different form the second species, the first gate conductor 143 comprise dopant two different species.

The dopant of the second species may be p-type dopant, such as boron or $BF_2$; or n-type dopant, such as phosphorus or arsenic.

In the illustrate embodiment, the first doping process is performed before the second doping process. In the some embodiments, the first doping process may be performed after the second doping process.

In some embodiments, instead of deposition, the dielectric layer on the first well mask 140 may be formed by oxidizing top surface of the gate poly layer 122, which may be likely to be deteriorated as being penetrated by the dopant used in the first doping process, thereby resulting in adverse impact on device performance. In some embodiments, to facilitate a replacement of the deteriorated gate dielectric layer, the removal of the first well mask 140 is required. Next, a mask for doping the first gate conductor 143 may be formed. In such embodiments, two masks are required for performing the first and the second doping processes.

It is worthy to mention that, in the illustrated embodiment, both of the first and the second doping process are performed via the same mask (i.e., the first well mask 140). Accordingly, the cost and complexity of process may be significantly reduced. The material and thickness of the dielectric layer 121 may be correspondingly selected and designed with respect to the first doping process, thereby alleviating the deterioration as being penetrated. In addition, an annealing process may be performed to repair the dielectric layer 121.

In the illustrated embodiment, since both of the first and the second doping process are performed via the first well mask 140, the first gate conductor 143 may be substantially as wide as the lateral span of the first well 142.

Figure 1E:
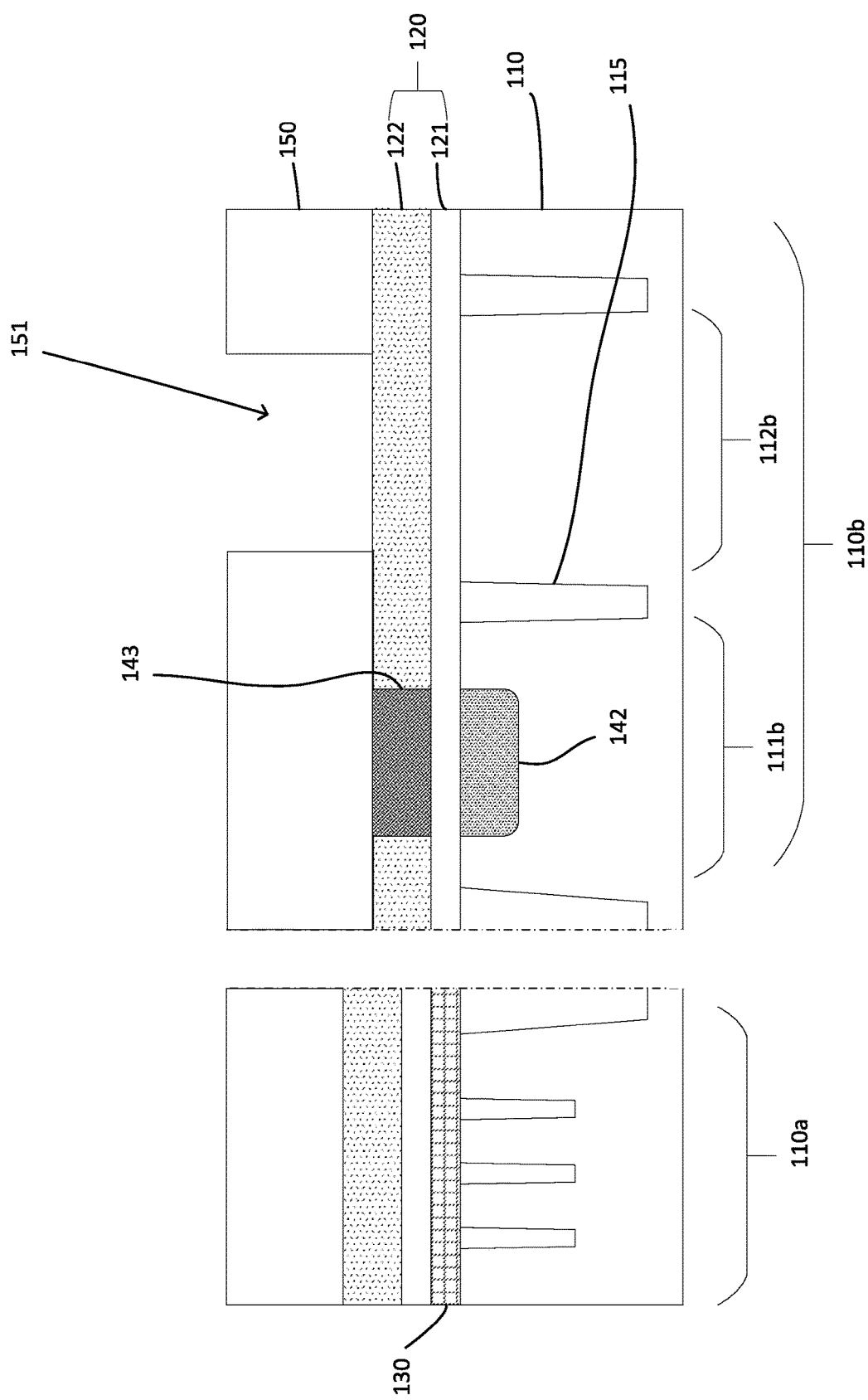

Referring to FIG. 1E, a second well mask 150 covering the first region 111b defining a second opening 151 that projectively overlaps the second region 112b to partially exposes the gate poly layer 122.

Figure 1F:
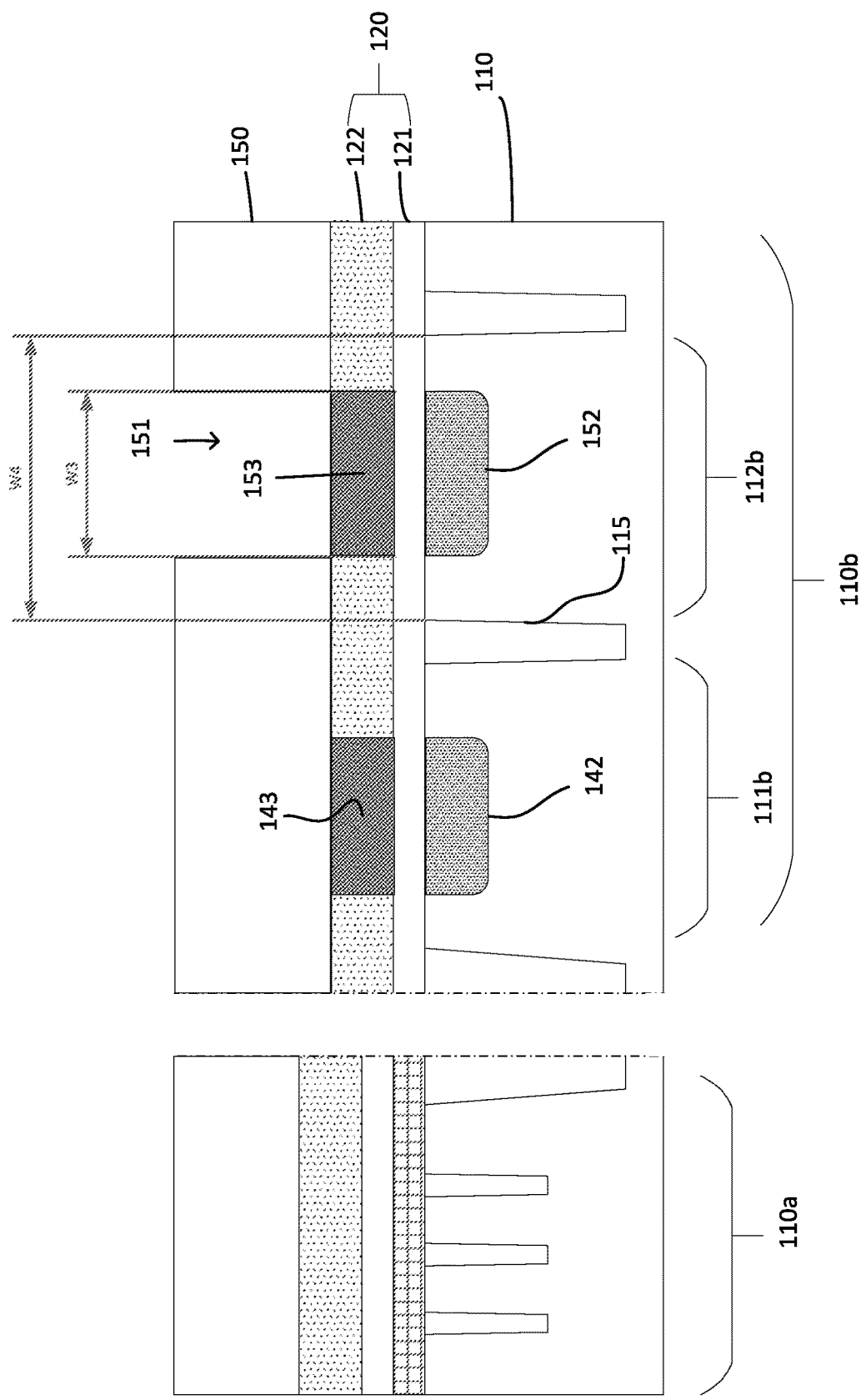

Referring to FIG. 1F, a third doping process is performed through the second opening 151 to form the second well 152. The third doping process may be perform via ion implantation. In the illustrated embodiment, during the third doping process, dopant of a third species (also referred as to impurity of a first species) penetrate the gate stack 120 and arrive at the substrate 110 to form the second well 152.

In the illustrated embodiment, where the third doping process is set for accelerating the dopant of the third species to penetrate the gate stack 120 through the second opening 151, the dopant of the third species are distributed in a portion of the dielectric layer 121 and a portion (e.g., the second gate conductor 153 shown in FIG. 1F) the gate poly layer 122 that overlaps with the second opening 151. In some scenarios, the dopant concentration of the third species in the second well 152 is greater than that in the gate stack 120.

In the illustrated embodiment, the second opening 151 defined by the second well mask 150 is narrower than the second region 112b, a lateral span $W_3$ of the second well 152 is narrower than (the width $W_4$ of) the second region 112b. In some embodiments, a width of the second opening may be defined substantially equal to that of the second region 112b, thereby the lateral span $W_3$ is about the same as the width $W_4$.

The dopant of the third species may be p-type dopant, such as boron or $BF_2$; or n-type dopant, such as phosphorus or arsenic.

In the illustrated embodiment, a fourth doping process is performed via the second well mask 150 to form a second gate conductor 153. The fourth doping process may be performed using ion implantation technique. In the illustrated embodiment, during the fourth doping process, dopant of a fourth species arrive the gate poly layer 122 of the gate stack 120. In the illustrated embodiment, the second gate conductor 153 may comprise not only the dopant of the fourth species, but also the dopant of the third species from the previously described third doping process. When the third species is different form the fourth species, the second gate conductor 153 comprise dopant two different species.

In the illustrate embodiment, the fourth doping process is performed before the third doping process. In the some embodiments, the third doping process may be performed after the fourth doping process.

The dopant of the fourth species may be p-type dopant, such as boron or BF2; or n-type dopant, such as phosphorus or arsenic.

In some embodiments, the dopant of the first species is identical to the dopant of the second species, and the dopant of the third species is identical to the dopant of the fourth species. For example, both of the dopant of the first and the second species are p-type dopant such as boron; both of the dopant of the third and the fourth species are n-type dopant such as phosphorus.

In some embodiments, the dopant of the first species is different from the dopant of the second species, and the dopant of the third species is different from the dopant of the fourth species. For example, both of the dopant of the first and the fourth species are p-type dopant such as boron; both of the dopant of the second and the third species are n-type dopant such as phosphorus.

Figure 1G:
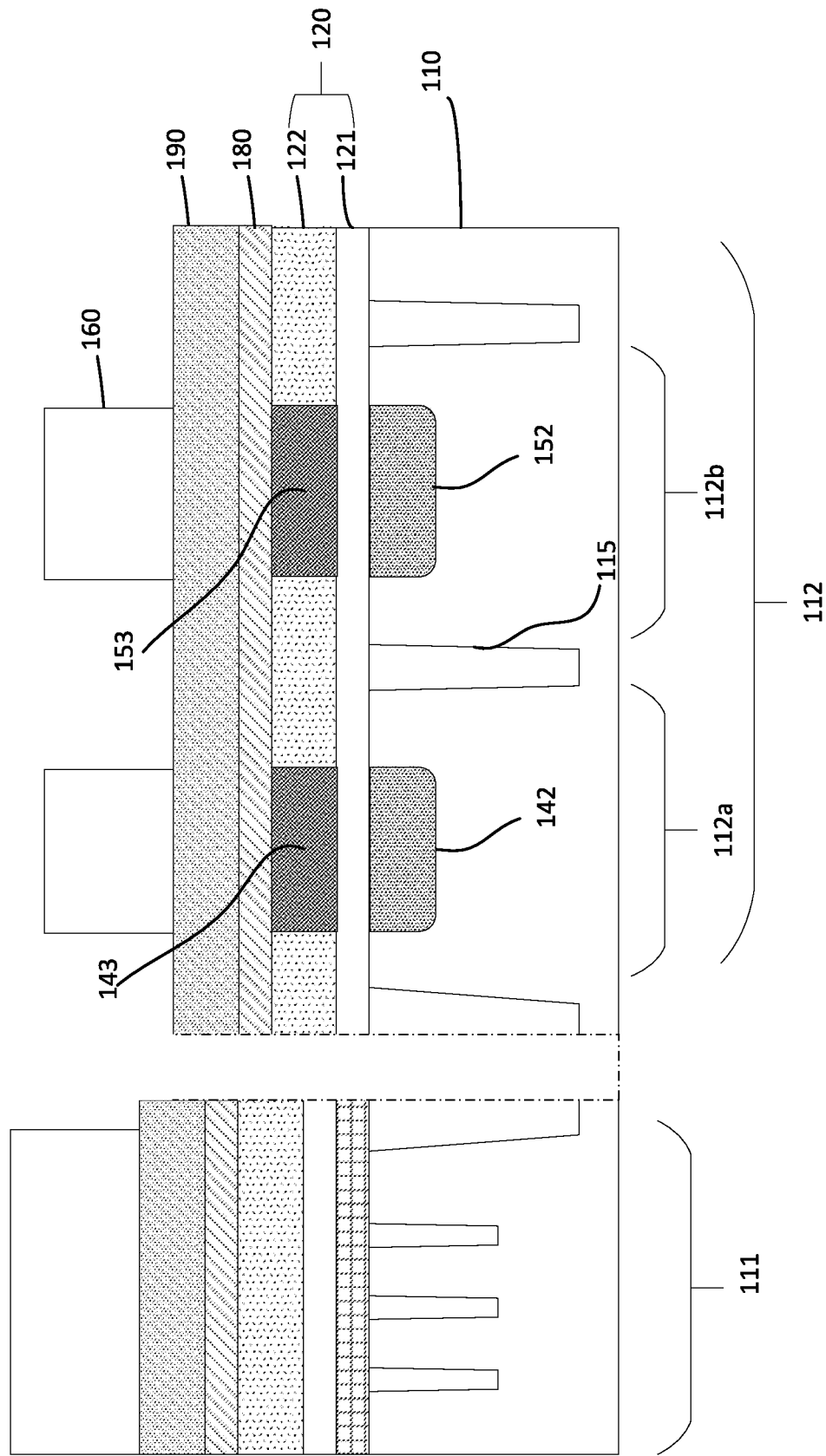

Referring to FIG. 1G, the second well mask 150 (shown in FIG. 1F) is removed. A conductive layer 180 and a hard mask layer 190 are sequentially disposed over the gate stack 120. A gate patterning mask 160 is subsequently formed over the hard mask layer 190 and covering portions of the conductive layer 180 projectively overlapping the first gate conductor 143 and the second gate conductor 153.

In some embodiments, the conductive layer 180 may be optional. For example, the hard mask layer may be directly contact with top surface of gate stack 120.

Figure 1H:
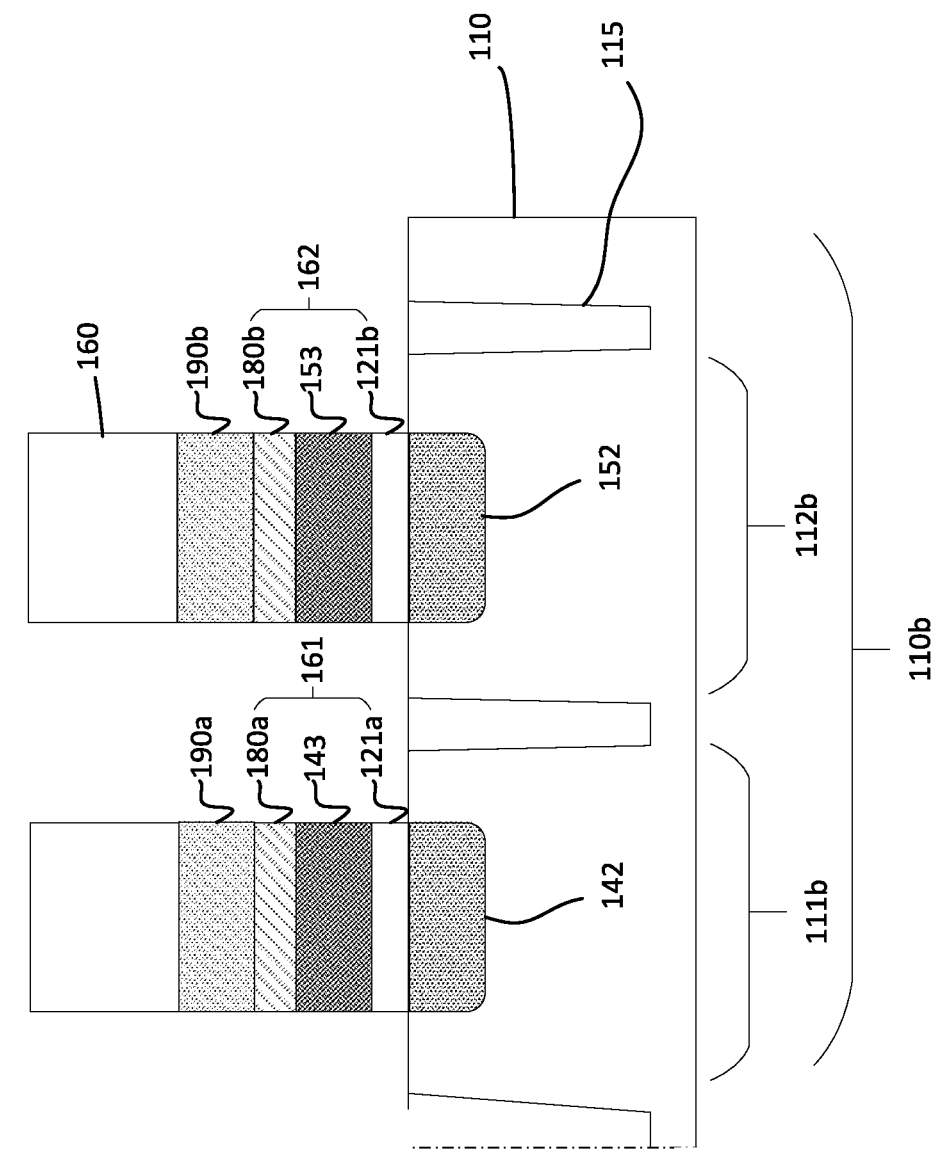

Referring to FIG. 1H, the hard mask layer 190 is recessed via the gate patterning mask 160 to form a first mask feature 190a and a second mask feature 190b. In the illustrated embodiment, the gate stack 120 is patterned to form a first gate feature 161 and a second gate feature 162 via the first mask feature 190a and the second mask feature 190b. In the illustrated embodiment, the first gate feature 161 is also referred to as a first gate stack that includes, from form bottom to top, a gate dielectric 121a, the gate conductor 143, and a gate metal 180a. In the illustrated embodiment, the second gate feature 162 is also referred to as a second gate stack that includes, from form bottom to top, a gate dielectric 121b, the second gate conductor 153, and a gate metal 180b.

Figure 1I:
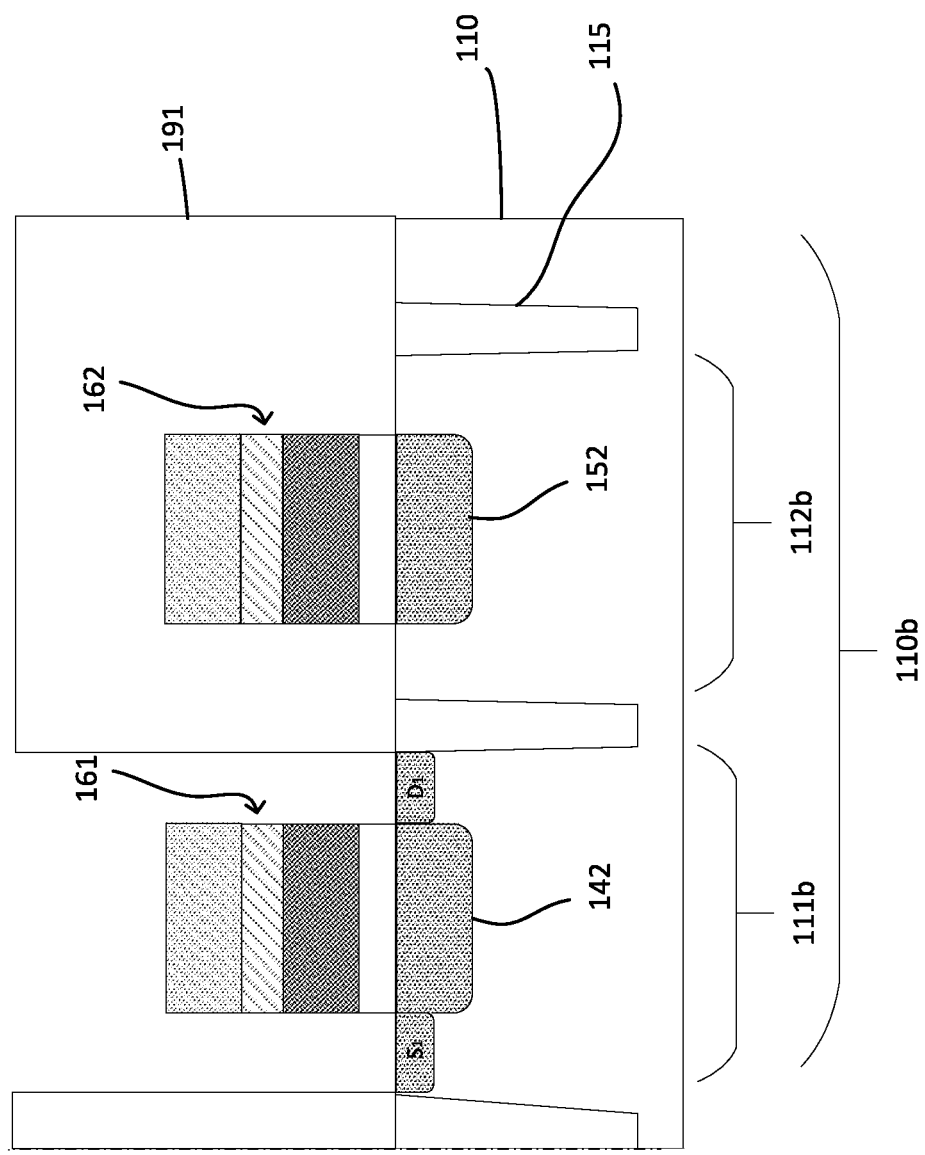

Referring to FIG. 1I, a first source and drain mask 191 is formed to cover the second region 112b while exposing the first region 111b. A fifth doping process utilizing dopant of a fifth species is performed via the first source and drain mask 191 to form a first source feature $S_1$ and a first drain feature $D_1$ at lateral sides of the first gate feature 161. In the illustrated embodiment, the first mask feature 190a is defined as wide as the first well 142, thereby the first source feature $S_1$ and the first drain feature $D_1$ may be formed outside the lateral span of the first well first well 142 and neighbor the first well 142. In some embodiments, the first mask feature may be defined narrower than the first well 142, thereby the first source feature and the first drain feature may be formed inside the lateral span of the first well first well 142.

In the illustrated embodiments, the first gate conductor 143 is covered thus being protected by the first mask feature 190a and the gate metal 180a from the impurities during the fifth doping process. In some embodiments, the first mask feature 190a (i.e., the patterned hard mask) may be removed before the fifth doping process, the gate metal 180a is thereby exposed and acted as a protective layer during the fifth doping process.

In some embodiments, when the aforementioned conductive layer 180 is omitted, the hard mask layer (e.g., hard mask layer 190) may be formed directly on the gate stack 120. As such, the first mask feature (e.g., the first mask feature 190a) may formed directly on the first gate conductor (e.g., first gate conductor 143) and acted as a protective layer during the fifth doping process.

In some embodiments, the gate metal 180a, the first gate conductor 143, the gate dielectric 121a, the first well 142, the first source feature S1 and the first drain feature D1 are collectively referred as to a first gate structure. According to some embodiments of instant disclosure, all of the first gate conductor 143, the gate dielectric 121a, and the first well 142 includes the dopant of the first species (also referred as to impurity of a first species).

Later, the first source and drain mask 191 is removed.

Figure 1J:
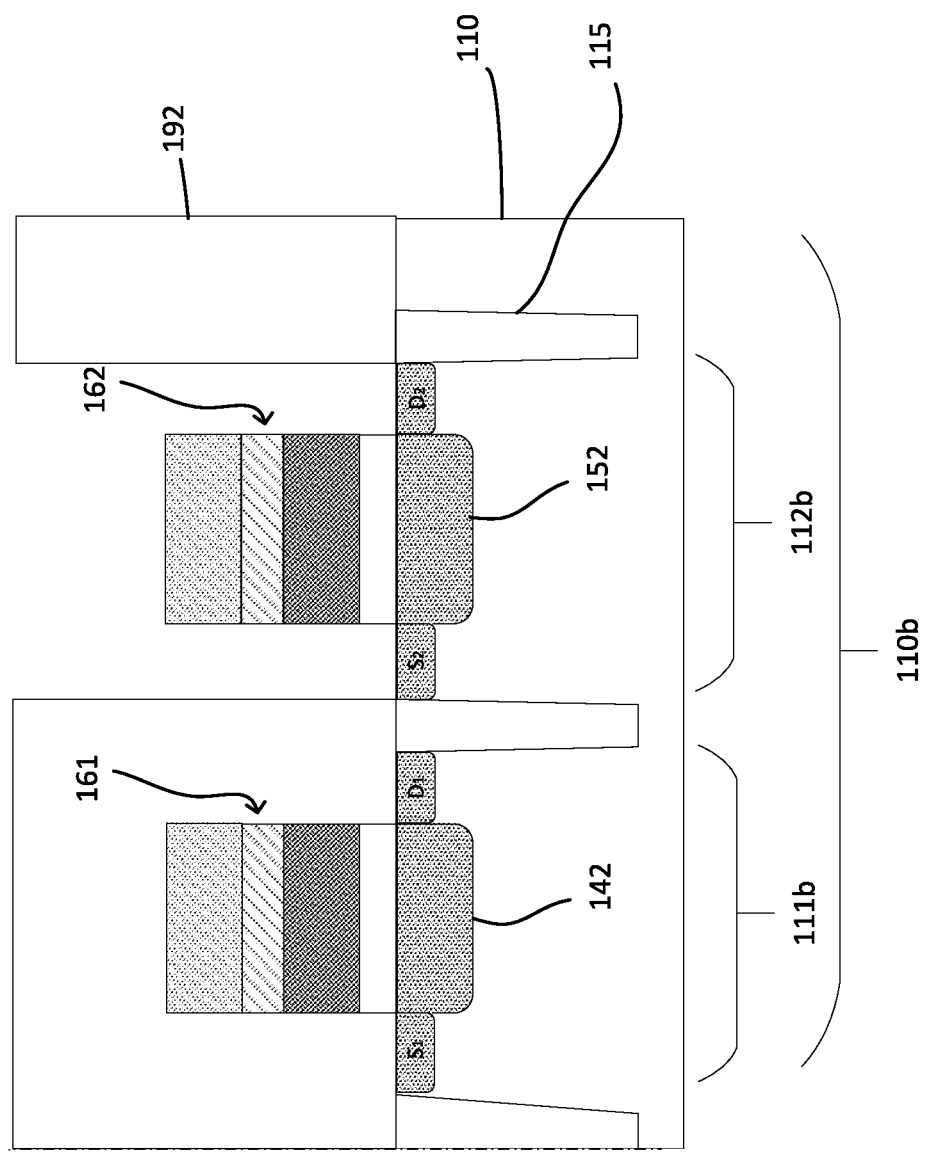

Referring to FIG. 1J, a second source and drain mask 192 covering the first region 111b while exposing the second region 112b is formed on the substrate 110. A sixth doping process utilizing dopant of a sixth species is performed via the second source and drain mask 192 to form a second source feature $S_2$ and a second drain feature $D_2$ at lateral sides of the second gate feature 162. In the illustrated embodiment, the second source feature $S_2$ and the first drain feature $D_2$ are neighboring the second well 152. For example, the second source feature $S_2$ and the first drain feature $D_2$ may be out of the lateral span of the second well 152.

In some embodiments, the gate metal 180b, the second gate conductor 153, the gate dielectric 121b, the second well 152, the second source feature S2 and the second drain feature D2 are collectively referred as to a second gate structure. According to some embodiments of instant disclosure, all of the second gate conductor 153, the gate dielectric 121b, and the second well 152 includes the dopant of the third species (also referred as to impurity of a second species).

In some embodiments, the processes described in FIGS. 1I to 1J are collectively referred as to a source and drain formation process.

Figure 1K:
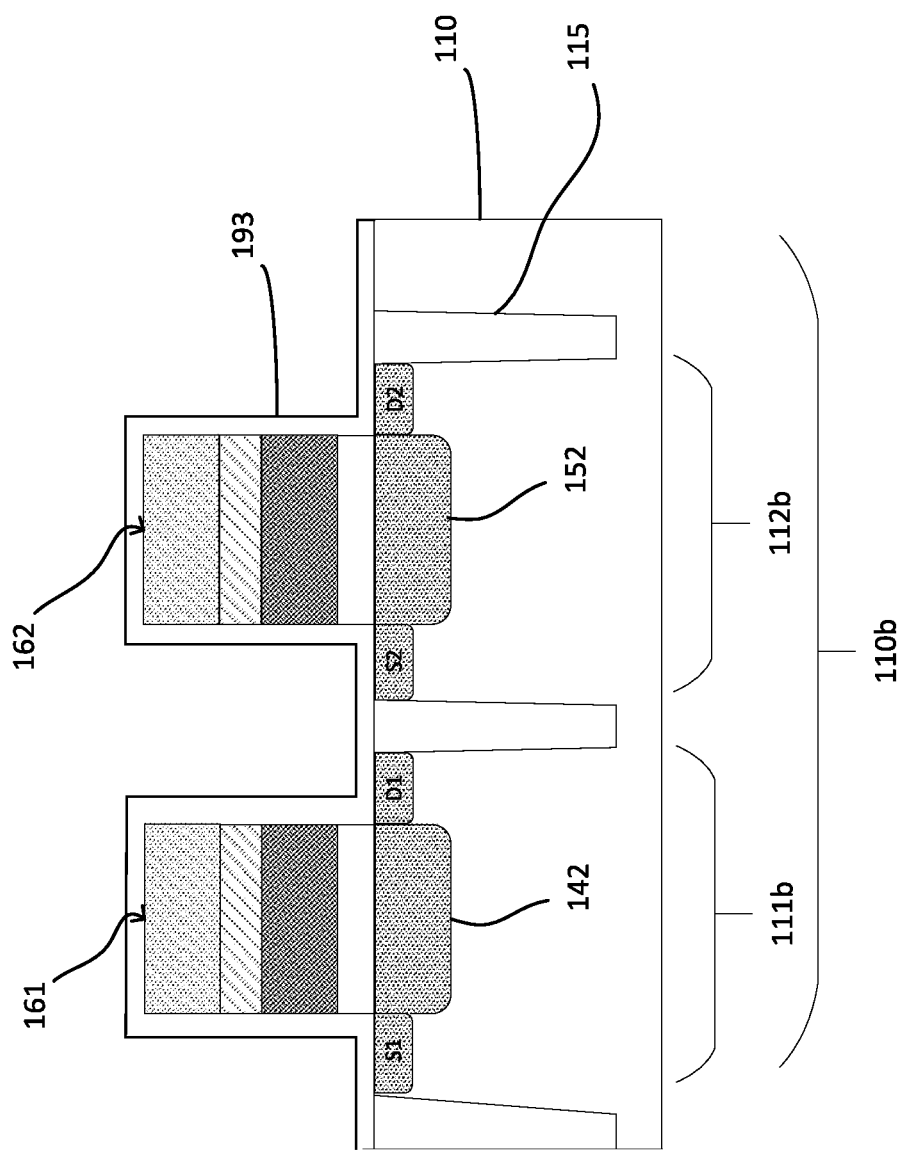

Referring to FIG. 1K, a liner 193 over the first gate feature 161 and the second gate feature 162 is disposed.

Figure 1L:
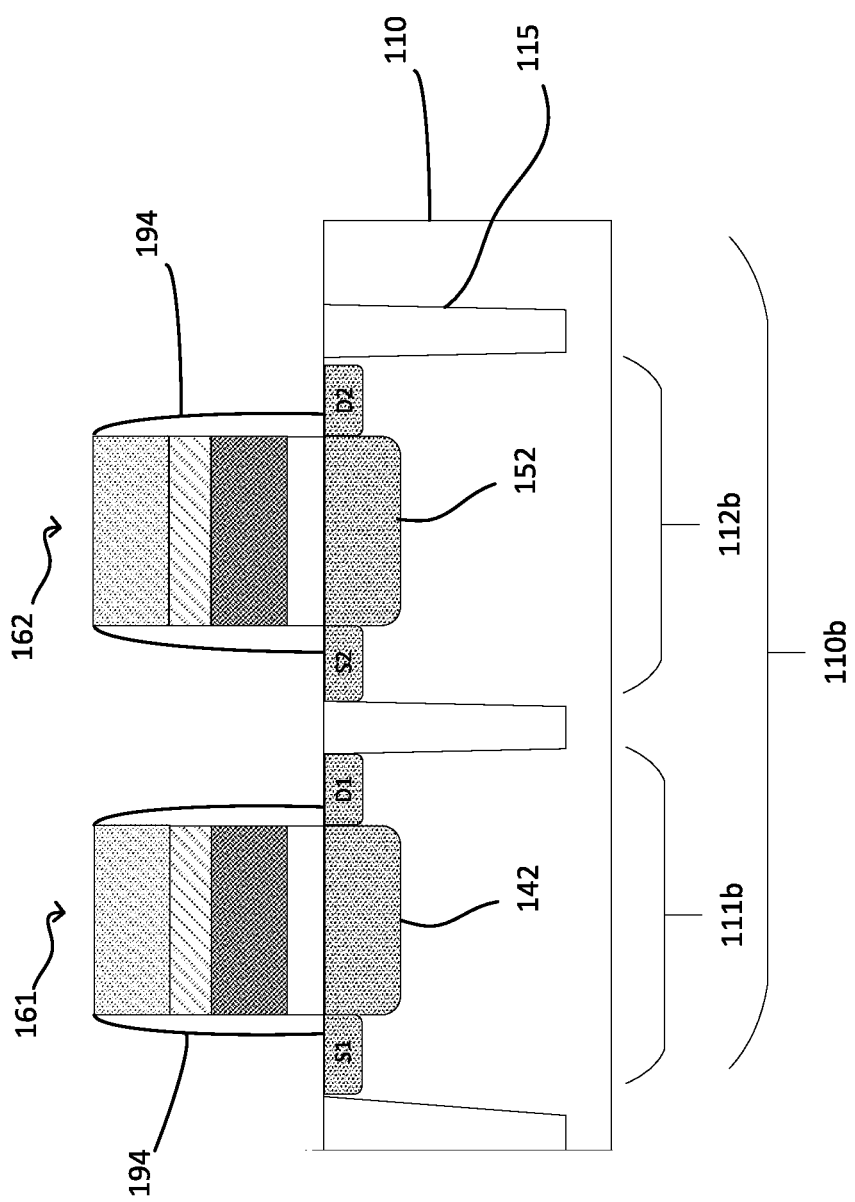

Referring to FIG. 1L, horizontal portions over and between the first gate feature 161 and the second gate feature 162 are removed to form a plurality pairs of spacer 194, wherein the pairs of the spacer 194 respectively covers both sidewalls of the first gate feature 161 and the second gate feature 162.

FIGS. 2A-2G illustrate regional cross-sectional view of intermediate stages of fabrication of semiconductor device in accordance with the instant disclosure. For illustrational simplicity and clarity, some detail/sub components of the exemplary device are not explicitly labeled in the instant figure.

Figure 2A:
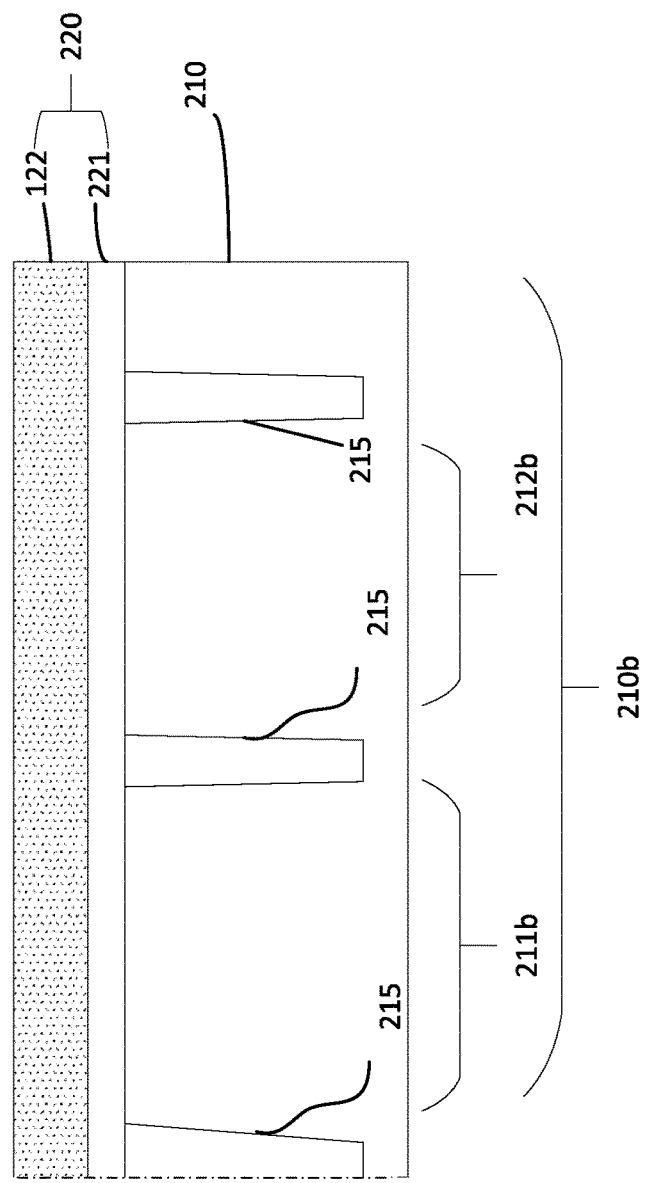
FIG. 2A-2G illustrate cross-sectional view of intermediate stages of fabricating an exemplary semiconductor device in accordance with some embodiments of the instant disclosure.
Figure 2A:
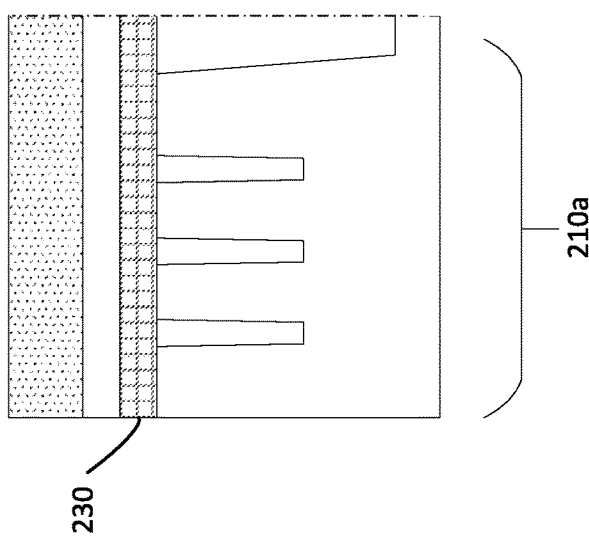

Referring to FIG. 2A, a substrate 210 of an exemplary device includes two co-planar arranged functional regions defined thereon, e.g., a cell region 210a and a periphery region 210b. Several regions may be defined in the periphery region 210b. For example, a first region 211b and a second region 212b in the periphery region 210b are defined by insulating structures 215.

In the illustrated embodiment, the gate stack 220 is disposed over the substrate 210. The gate stack 220 extends across the first region 211b and the second region 112b. The gate stack 220 includes, from bottom to top, a dielectric layer 221 and a gate poly layer 122.

In the illustrated embodiment, before the formation of the gate stack 220, a interlayer dielectric layer 230 covering the cell region 210b is optionally formed.

Figure 2B:
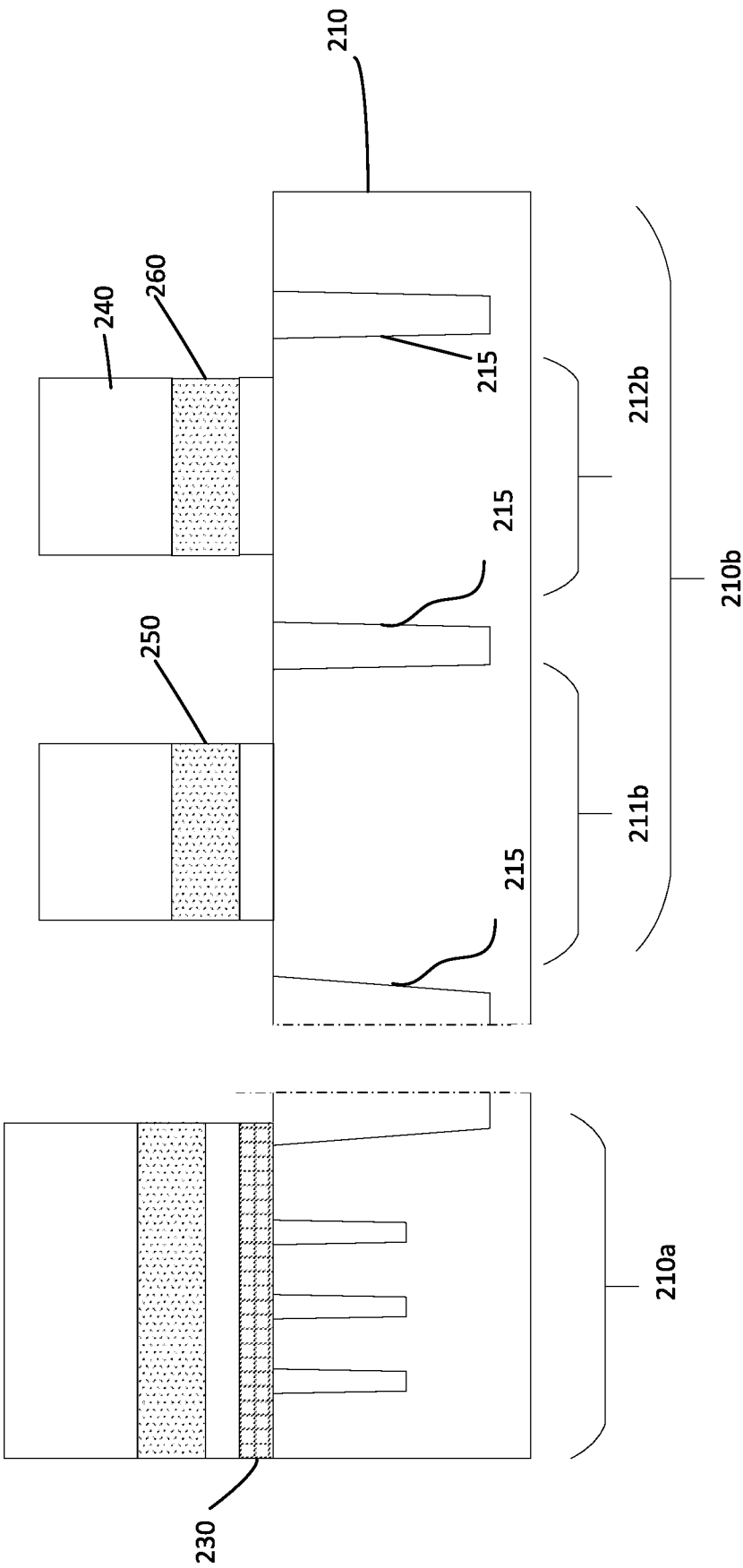

Referring to FIG. 2B, a photoresist layer 240 is formed over the gate stack 220. Next, the gate stack 220 is patterned via the photoresist layer 240 to form a first gate feature 250 and a second gate feature 260 respectively partially covers the first region 211b and the second region 212b of the substrate 210.

Figure 2C:
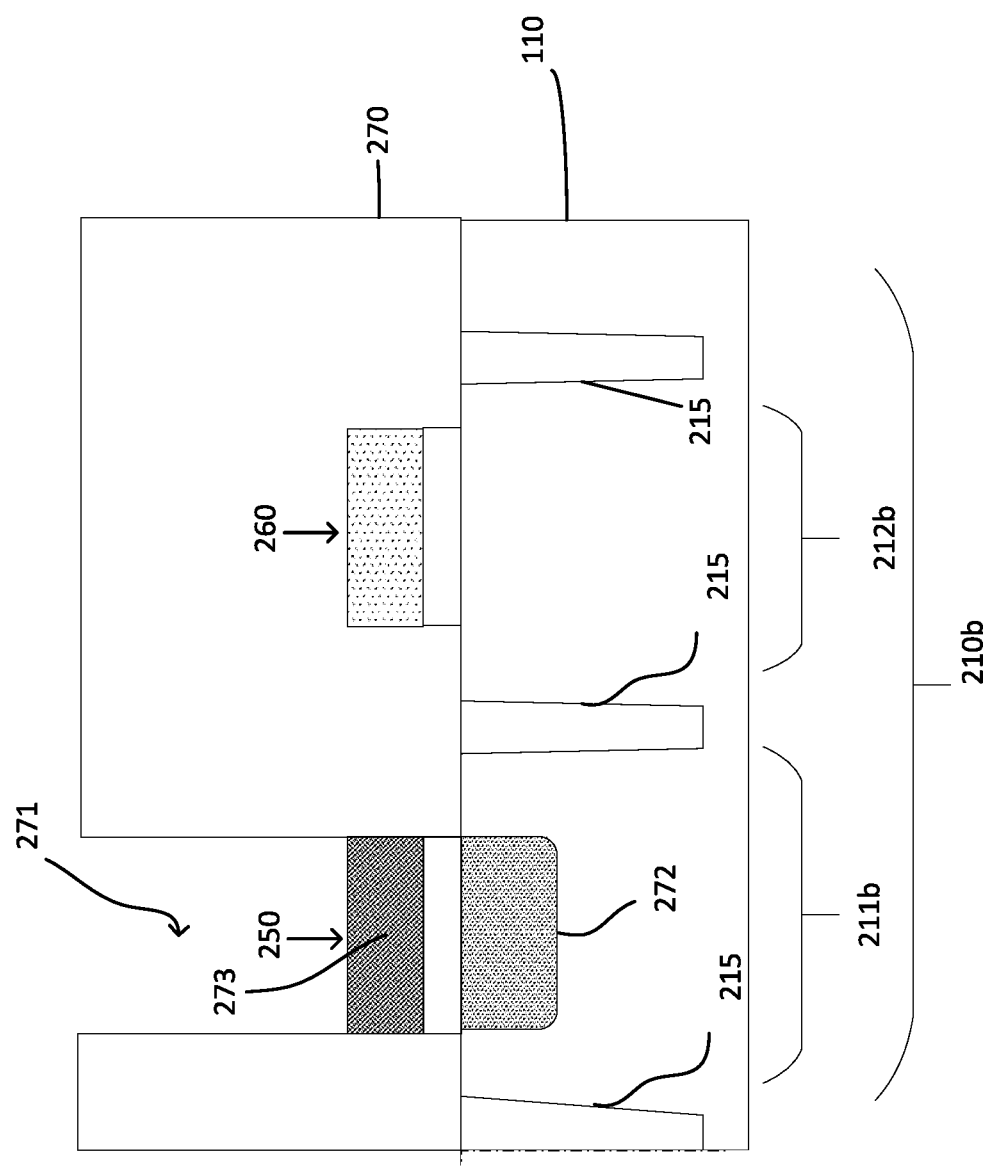

Referring to FIG. 2C, the photoresist layer 240 is removed thus exposing the first gate feature 250 and the second gate feature 260. Subsequently, a first mask layer defining a first opening is formed over the substrate 210. At least the first gate feature 250 is exposed from the first mask layer. For example, in the illustrated embodiment, the first gate feature 250 is exposed from a first mask layer 270 through a first opening 271. In some embodiments, the first gate feature 250 and neighboring top surface of the first region 211b are both exposed form the first mask layer.

Later, a first doping process is performed via the first mask layer 270 to form a first well 272 beneath the first gate feature 250. The first doping process may be perform via ion implantation. In the illustrated embodiment, during the first doping process, dopant of a first species penetrate the first gate feature 250 and arrive at the substrate 210 to form the first well 272. In the illustrated embodiments, the first opening 271 is narrower than the first region 211b, thereby a lateral span of the first well 272 is narrower than the first region 211b in a cross section thereof. In the illustrated embodiment, a width of the opening 271 defined by the first mask layer 270 is substantially equivalent to that of the first gate feature 250, therefore a lateral span of the first well 272 is substantially equivalent to that of the first gate feature 250. The dopant of the first species may be p-type dopant, such as boron or BF2; or n-type dopant, such as phosphorus or arsenic.

Subsequently, a second doping process is performed through the first opening 271 of the first mask layer 270 to form a first gate conductor 273 at the first gate feature 250. Later, the first mask layer 260 is removed.

In the illustrated embodiment, the first gate feature 250 is also referred to as a first gate stack that includes the gate conductor 273 and a gate dielectric 221a.

Figure 2D:
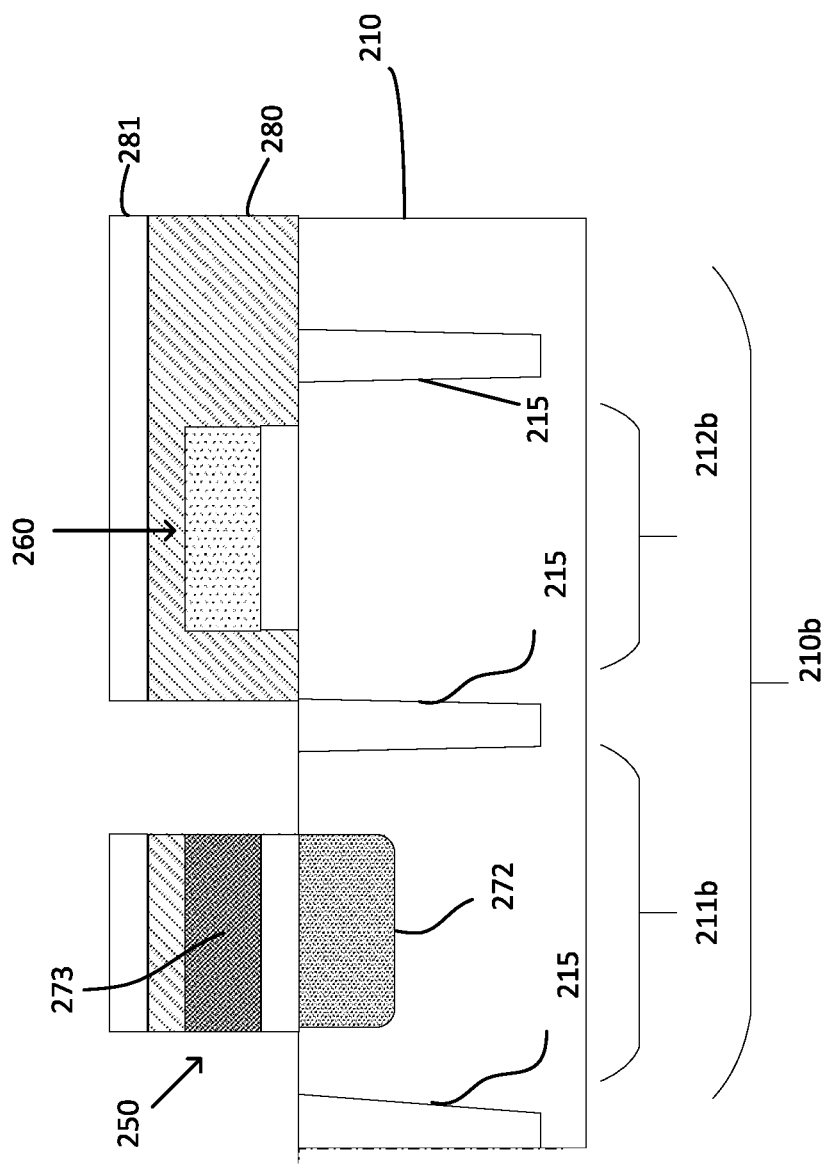

Referring to FIG. 2D, a first source and drain mask 280 is subsequently formed over the substrate 210. The first source and drain mask 280 covers the second region 212b and the first gate feature 250 while exposing portions of top surface of the first region 211b abuts lateral sides of the first gate stack 250. A photoresist layer 281 may be formed to pattern the first source and drain mask 280.

Figure 2E:
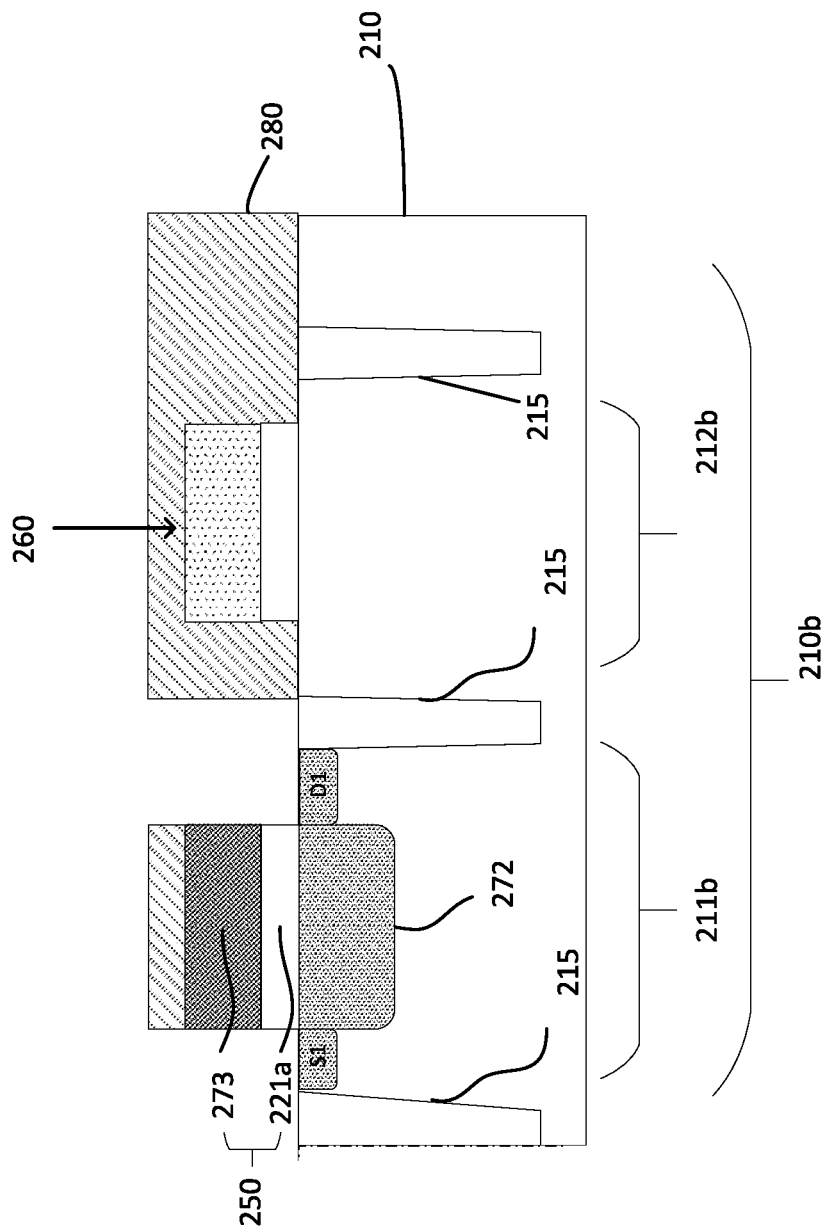

Referring to FIG. 2E, a third doping process is performed via the first source and drain mask layer 280 to form a first source feature $S_1$ and a first drain feature $D_1$ in the first region 211b at lateral sides of the first well 272.

In some embodiments, the first gate conductor 273, a gate dielectric 221a, the first well 272, the first source feature S1 and the first drain feature D1 are collectively referred as to a first gate structure. According to some embodiments of instant disclosure, due to the energy loss of the dopant of the first species that previously described, all of the first gate conductor 273, the gate dielectric 221a, and the first well 272 includes the dopant of the first species (also referred as to impurity of a first species). However, the dopant concentration of the first species in the first well 272 may be greater than that of the first gate conductor 273 and the gate dielectric 221a. When the first species is different form the second species, the first gate conductor 273 comprise dopant two different species.

Later, the first source and drain mask 280 is removed.

Figure 2F:
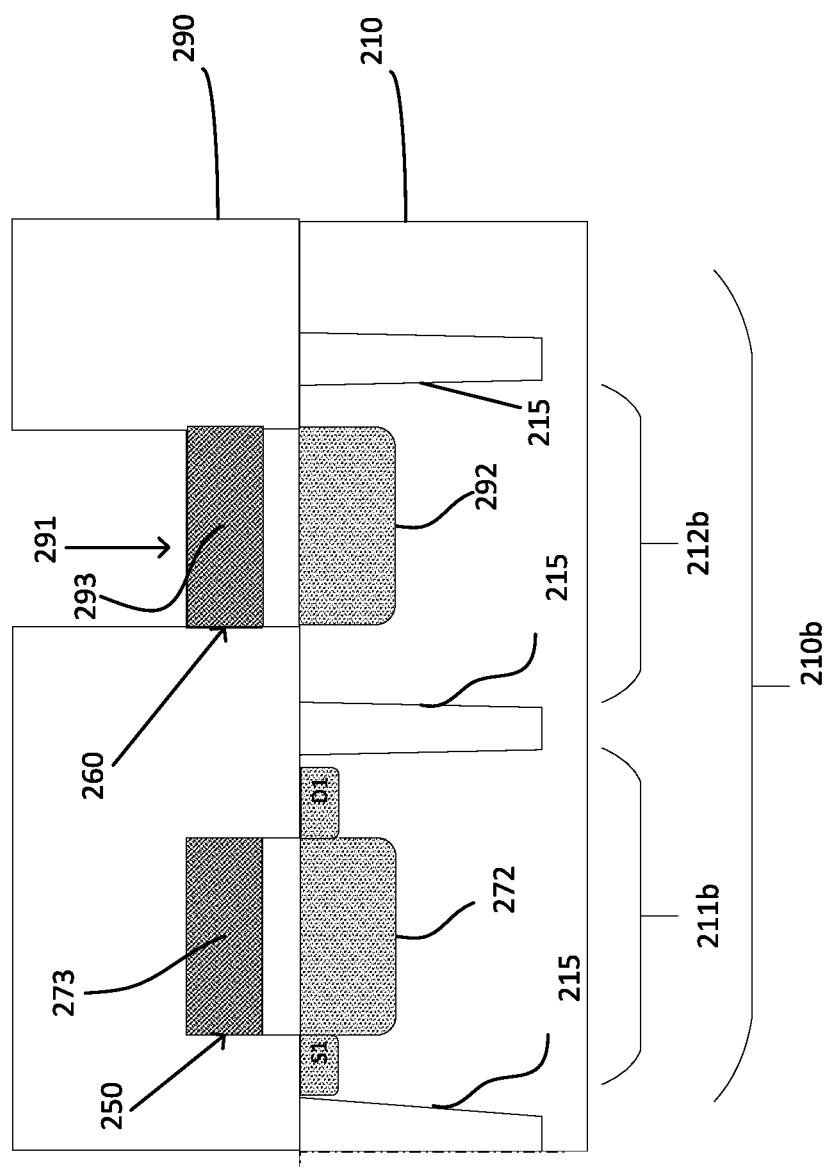

Referring to FIG. 2F, a second mask layer 290 defining a second opening 291 narrower than the second region 112b is formed over the substrate 210. At least the second gate feature 260 is exposed from the second mask layer. For example, in the illustrated embodiment, the second gate feature 260 is exposed from the second mask layer 290. In some embodiments, the second gate feature 260 and neighboring top surface of the second region 112b are both exposed form the second mask layer.

Later, a fourth doping process is performed via the second mask layer 290 to form a second well 292 beneath the second gate feature 260. The fourth doping process may be perform via ion implantation. In the illustrated embodiment, during the fourth doping process, dopant of a fourth species penetrate the second gate feature 260 and arrive at the substrate 210 to form the second well 292. A lateral span of the second well 292 is narrower than the second region 212b in a cross section thereof. In the illustrated embodiment, a width of the opening 291 defined by the second mask layer 290 is substantially equivalent to that of the second gate feature 260, therefore a lateral span of the second well 292 is substantially equivalent to that of the second gate feature 260. The dopant of the fourth species may be p-type dopant, such as boron or BF2; or n-type dopant, such as phosphorus or arsenic.

Subsequently, a fifth doping process is performed through the opening 291 of the second mask layer 290 to form a first gate conductor 293 at the first gate feature 273. Later, the second mask layer 290 is removed.

In the illustrated embodiment, the second gate feature 260 is also referred as to a second gate stack that includes the gate conductor 293 and a gate dielectric 221b.

Figure 2G:
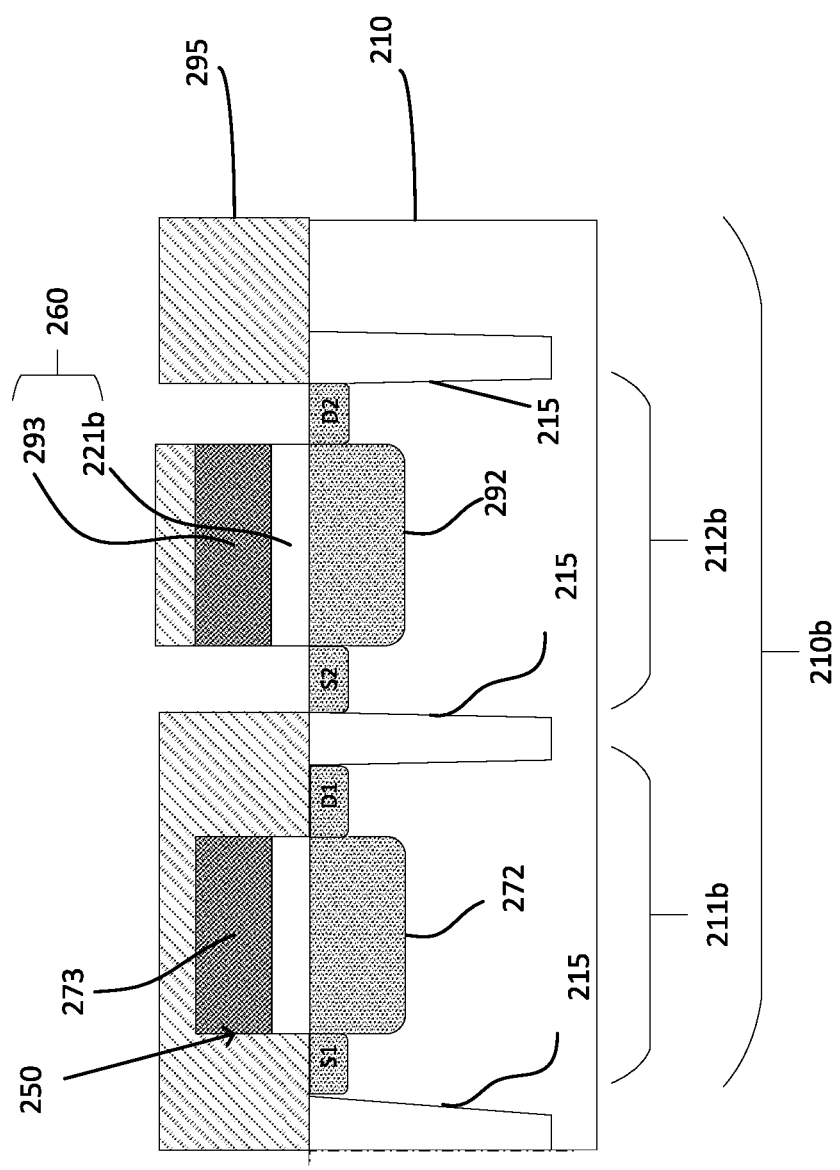

Referring to FIG. 2G, a second source and drain mask 295 is subsequently formed over the substrate 210. The second source and drain mask 295 covers the first region 211b and the second gate feature 260 while exposing portions of top surface of the second region 212b abuts lateral sides of the second gate stack 260. A photoresist layer may be formed on the second source and drain mask so as to pattern the second source and drain mask. A sixth doping process is performed via the second source and drain mask layer 295 to form a second source feature $S_2$ and a second drain feature $D_2$ in the second region 212b at lateral sides of the second well 292.

In some embodiments, the second gate conductor 293, the gate dielectric 221b, the second well 292, the second source feature S2 and the second drain feature D2 are collectively referred as to a second gate structure. According to some embodiments of instant disclosure, due to the energy loss of the dopant of the fourth species, all of the second gate conductor 293, the gate dielectric 221b, and the second well 292 includes the dopant of the fourth species (also referred as to impurity of a second species). However, the dopant concentration of the fourth species in the second well 292 may be greater than that of the second gate conductor 293 and the gate dielectric 221a. When the fourth species is different form the fifth species, the second gate conductor 293 comprise dopant two different species.

Subsequently, pairs of spacer laterally covering both side walls of the first gate feature 250 and the second gate feature 260 may be formed utilizing the exemplary fabrication processes being described in accordance with the aforementioned embodiments. (for example, processes described in association with FIG. 1K-1L).

FIGS. 3A-3D illustrate regional cross-sectional view of intermediate stages of fabrication of semiconductor device in accordance with the instant disclosure. For illustrational simplicity and clarity, some detail/sub components of the exemplary device are not explicitly labeled in the instant figure.

Figure 3A:
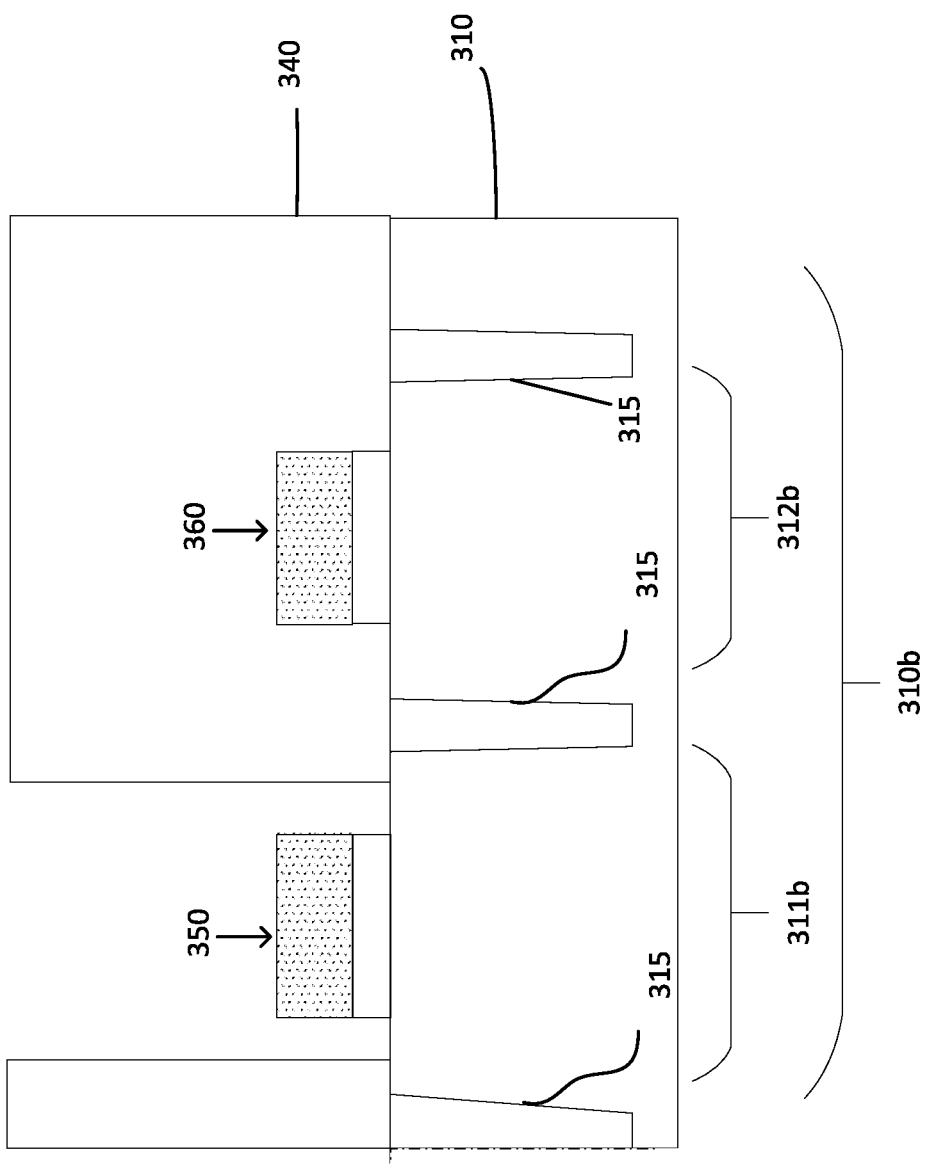
FIG. 3A-3D illustrate cross-sectional view of intermediate stages of fabricating an exemplary semiconductor device in accordance with some embodiments of the instant disclosure.

Referring to FIG. 3A, a substrate 310 of an exemplary device includes two co-planar arranged functional regions defined thereon, e.g., a cell region and a periphery region 310b. Several regions may be defined in the periphery region 310b. For example, a first region 311b and a second region 312b in the periphery region 310b are defined by insulating structures 315.

A first gate feature 350 and a second gate feature 360 are formed over the substrate 310. The first gate feature 350 and second gate feature 360 respectively partially covers the first region 311b and the second region 312b of the substrate 310.

In the illustrated embodiment, the substrate 310, the insulating structures 315, the first region 311b, the second region 312b, the first gate feature 350, and the second gate feature 360 are formed utilizing the exemplary fabrication processes being described in accordance with the aforementioned embodiments. (for example, processes described in association with FIG. 2A-2C).

A first mask layer 370 defines a first opening 371 is formed over the substrate 310. In the illustrated embodiment, the first opening 371 exposes the first gate feature 350 and portions of top surface of the first region 311b that abuts the first gate feature 350.

In the illustrated embodiments, the first opening 371 is narrower than the first region 111b. As such, portions of top surface of the first region 311b that abuts the insulation structures 315 are covered by the first mask layer 370.

In some embodiments, top surface of the first region 311b may be free from the first mask layer coverage. For example, first opening defined by the first mask layer may has a width substantially equal to that of the first region 311b.

Figure 3B:
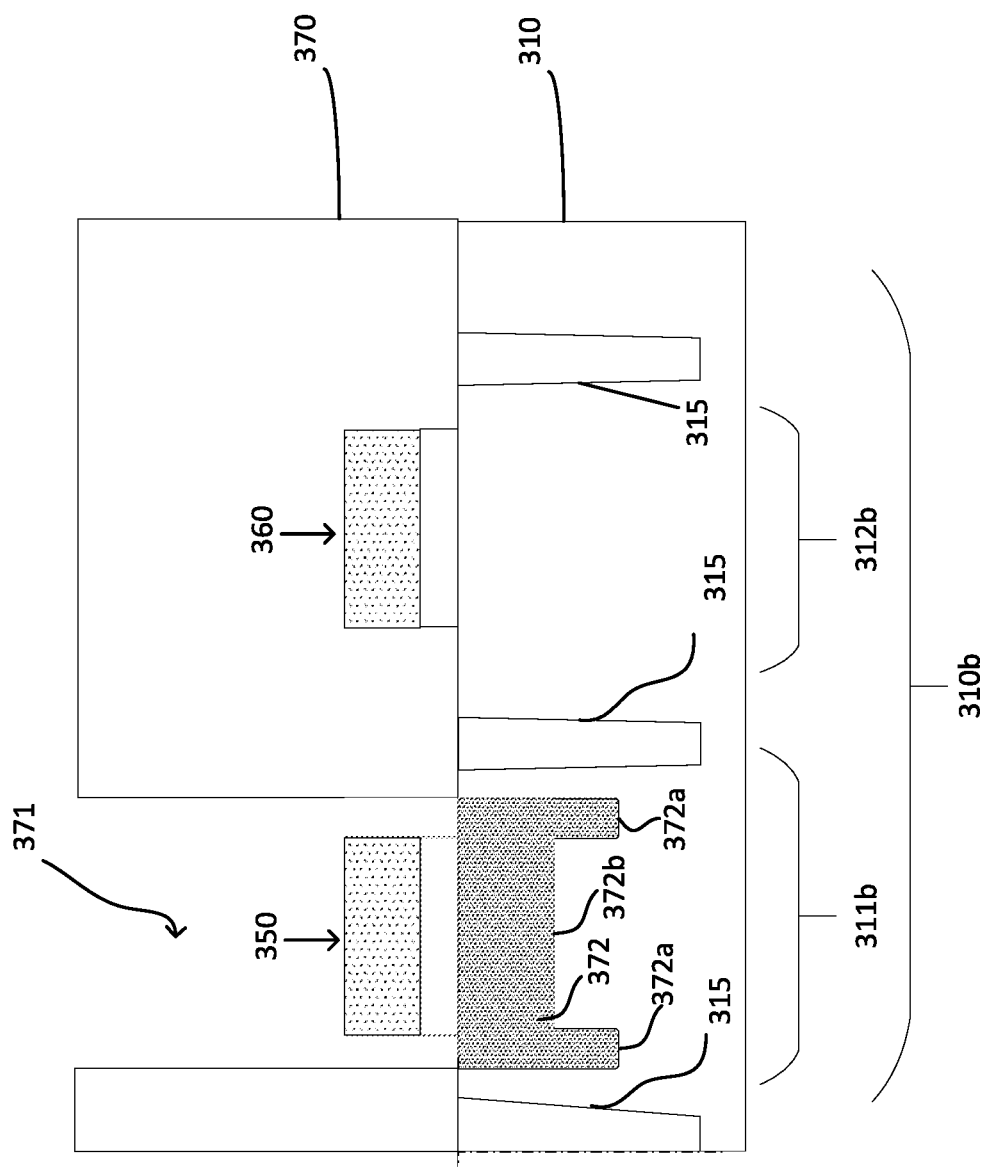

Referring to FIG. 3B, a first doping process is performed via the first mask layer 370 to form a first well 372 beneath the first gate feature 350. The first doping process may be performed using ion implantation technique. In the illustrated embodiment, during the first doping process, dopant of a first species penetrate the first gate feature 350 and arrive at the substrate 310 to form the first well 372. In the illustrated embodiment, a lateral span of the first well 372 is narrower than the first region 311b in a cross section thereof.

In the illustrated embodiment, a cross-sectional profile of the first well 372 including two side portions 372a formed deeper than a middle portion 372b there-between. The energy loss of the dopant of the first species during penetrating the first gate feature 350 may attribute to the formation of the relatively shallower middle portion 372b. The middle portion 372b may as wide as the first gate feature 350.

The dopant of the first species may be p-type dopant, such as boron or BF2; or n-type dopant, such as phosphorus or arsenic.

Figure 3C:
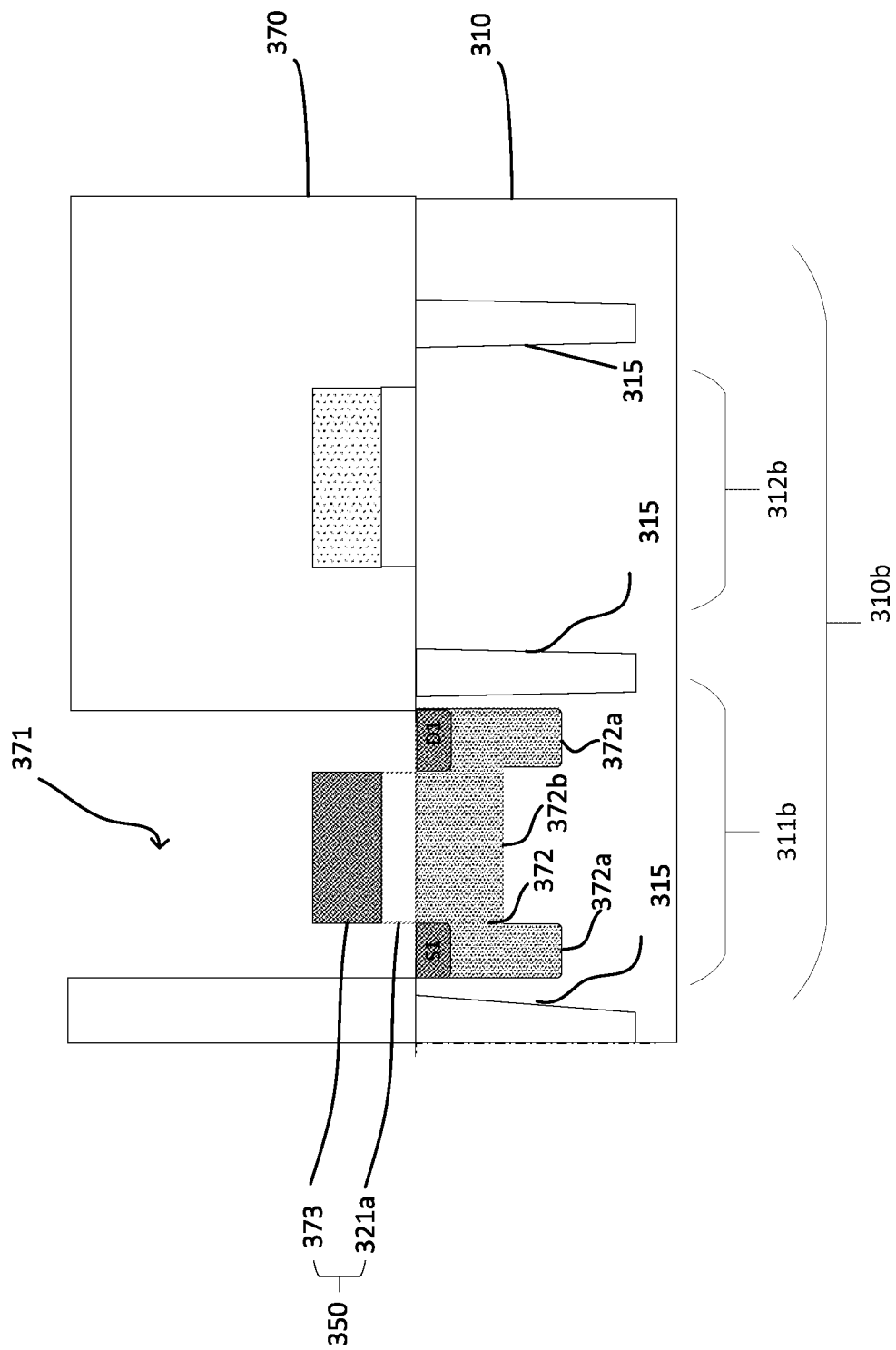

Referring to FIG. 3C, subsequently, a second doping process is performed through the first opening 371 of the first well mask 360 to form a first gate conductor 371 at the first gate feature 350. In the illustrated embodiment, a third doping process may be performed via the first mask layer 370, to form a first source feature $S_1$ and a first drain feature $D_1$ respectively in the two side portions of the first well 372.

In some embodiments, dopant of a second species utilized in the second doping process is identical to dopant of a third species utilized in the third doping process. The second doping process and the third doping process may be performed concurrently.

In the illustrated embodiment, the first gate feature 350 is also referred as to a first gate stack that includes the gate conductor 373 and a gate dielectric 321a. According to some embodiments of instant disclosure, due to the energy loss of the dopant of the first species, all of the first gate conductor 373, the gate dielectric 321a, and the first well 372 includes the dopant of the first species (also referred as to impurity of a first species). However, the dopant concentration of the first species in the first well 372 may be greater than that of the first gate conductor 373 and the gate dielectric 321a. When the first species is different form the second species, the first gate conductor 373 comprise dopant two different species.

In some embodiments, the first gate conductor 373, a gate dielectric 321a, the first well 372, the first source feature $S_1$ and the first drain feature $D_1$ are collectively referred as to a first gate structure.

Figure 3D:
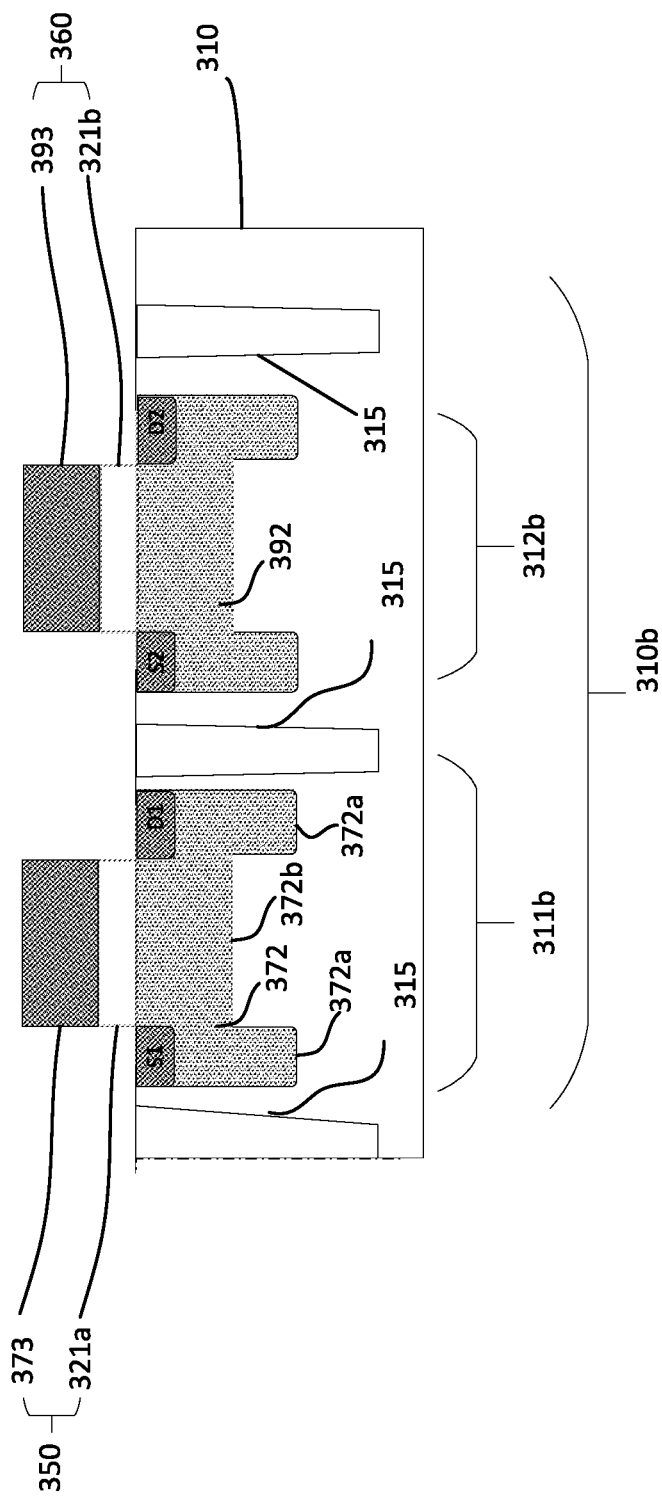

Referring to FIG. 3D, a second gate structure including a second gate conductor 393, a gate dielectric 321b, a second well 392, a second source feature S2 and a second drain feature D2 are formed utilizing the exemplary fabrication processes being described in accordance with the aforementioned embodiments (for example, processes described in association with FIG. 3A-3B). According to some embodiments of instant disclosure, all of the second gate conductor 373, the gate dielectric 321b, and the second well 392 includes impurity of a second species. However, the dopant concentration of the impurity of a second species in the second well 392 may be greater than that of the second gate conductor 393 and the gate dielectric 32 lb. The second gate conductor 393 may comprise dopant of two different species.

Subsequently, pairs of spacer laterally covering both side walls of the first gate feature 350 and the second gate feature 360 may be formed utilizing the exemplary fabrication processes being described in accordance with the aforementioned embodiments. (for example, processes described in association with FIG. 1K-1L).

In the illustrated embodiment, the second gate feature 360 is also referred as to a second gate stack that includes the gate conductor 393 and a gate dielectric 321*b*.

Accordingly, one aspect of the instant disclosure provides a method comprises receiving a substrate having a first region and a second region defined thereon and an insulating structure formed there-between; forming a gate stack including a dielectric layer and a gate poly layer formed thereon extending across the first region and the second region; forming a first well mask covering the second region, wherein the first well mask defines a first opening that exposes a portion of the gate poly layer over the first region; performing a first doping process, through the first opening of the first well mask and through the gate stack, to form a first well in the substrate beneath the first opening; and performing a second doping process to the gate poly layer via the first well mask to form a first gate conductor.

In some embodiments of the instant disclosure, the method further comprises forming a second well mask covering the first region, wherein the second well mask defines a second opening that exposes a portion of the gate poly layer over the second region; performing a third doping process, through the second opening of the second well mask and through the gate stack, to form a second well in the substrate beneath the second opening; and performing a fourth doping process to the gate poly layer via the second well mask to form a second gate conductor.

In some embodiments of the instant disclosure, the dopant of a first species utilized in the first doping process is identical to the dopant of a second species utilized in the second doping process; and wherein the dopant of a third species utilized in the third doping process is identical to the dopant of a fourth species utilized in the fourth doping process.

In some embodiments of the instant disclosure, the first opening defined by the first well mask is narrower than the first region in a cross section thereof; and a lateral span of the first well is narrower than the first region in a cross section thereof.

In some embodiments of the instant disclosure, the method further comprises forming a gate patterning mask covering the first gate conductor and the second gate conductor; recessing the gate stack form a first gate feature and a second gate feature via the gate patterning mask; and performing a source and drain formation process to form a first source feature and a first drain feature at lateral sides of the first gate feature and to form a second source feature and a second drain feature at lateral sides of the second gate feature.

In some embodiments of the instant disclosure, the method further comprises disposing a conductive layer over the first gate stack prior to the forming the gate patterning mask; wherein the gate patterning mask covers portions of the conductive layer projectively overlapping the first gate conductor and the second gate conductor.

In some embodiments of the instant disclosure, the method further comprises disposing a liner over the first gate feature and the second gate feature; and removing horizontal portions over and between the first gate feature and the second gate feature to form a plurality pairs of spacer, wherein the pairs of the spacer respectively covers both sidewalls of the first gate feature and the second gate feature.

In some embodiments of the instant disclosure, in a cross section of the substrate, the first opening defined by the first well mask is narrower than the first region; in the cross section of the substrate, a lateral span of the first well is narrower than the first region; and wherein the source and drain formation process comprises forming a first source and drain mask covering the second region while exposing the first region, performing a fifth doping process, via the first source and drain mask, to form the first source feature and the first drain feature neighboring the first well, removing the first source and drain mask, forming a second source and drain mask covering the first region while exposing the second region, and performing a sixth doping process, via the second source and drain mask, to form the second source feature and the second drain feature neighboring the second well.

Accordingly, one aspect of the instant disclosure provides a method comprises receiving a substrate having a first region and a second region defined thereon and an insulating structure formed there-between; disposing a gate stack including a dielectric layer and a gate poly layer formed thereon, the gate stack extends across the first region and the second region; patterning the gate stack to form a first gate feature and a second gate feature respectively partially covers the first region and the second region of the substrate; forming a first mask layer defining a first opening over the substrate, wherein at least the first gate feature is exposed from the first mask layer; performing a first doping process, penetrating the first gate feature via the first well mask, to the first region of the substrate to form a first well beneath the first gate feature, wherein a lateral span of the first well is narrower than the first region in a cross section; and performing a second doping process, through the first opening of the first well mask, to form a first gate conductor at the first gate feature.

In some embodiments of the instant disclosure, a width of the first opening defined by the first mask layer is substantially equivalent to that of the first gate feature; the method further comprising forming, over the substrate, a first source and drain mask covering the second region and the first gate feature while exposing portions of top surface of the first region abuts lateral sides of the first gate feature; performing a third doping process, via the first source and drain mask layer, to form a first source feature and a first drain feature (d2) in the first region at lateral sides of the first well.

In some embodiments of the instant disclosure, the first opening defined by the first mask layer is wider than the first gate feature; a cross-sectional profile of the first well including two side portions formed deeper than a middle portion there-between.

In some embodiments of the instant disclosure, the method further comprises performing a third doping process, via the first mask layer, to form a first source feature and a first drain feature respectively in the two side portions of the first well.

In some embodiments of the instant disclosure, dopant of a second species utilized in the second doping process is identical to dopant of a third species utilized in the third doping process; and the second doping process and the third doping process are performed concurrently.

Accordingly, one aspect of the instant disclosure provides a device comprises a substrate includes a plurality of insulating structure defining a first region and a second region; a first gate structure over the first region, including a first gate stack including a gate dielectric and a gate conductor formed thereon, a first well feature beneath the first gate stack, wherein both of the first gate stack and the first well feature includes impurity of a first species, and a first source feature and a first drain feature respectively neighbors opposite edges of the first gate stack; and a second gate structure over the second region, including a second gate stack including a gate dielectric and a gate conductor formed thereon, a second well feature beneath the second gate stack feature, wherein both of the second gate stack and the second well feature includes impurity of a second species, and a second source feature and a second drain feature respectively neighbors opposite edges of the second gate stack.

In some embodiments of the instant disclosure, the first well feature includes two side portions and a relatively shallower middle portion there-between.

In some embodiments of the instant disclosure, the middle portion of the first well has a width substantially equal to that of the first gate stack.

In some embodiments of the instant disclosure, the first source feature and the first drain feature are respectively formed in the two side portions of the first well feature.

In some embodiments of the instant disclosure, the first source feature and the first drain feature are formed neighboring the first well feature.

In some embodiments of the instant disclosure, a lateral span of the first well feature is narrower than the first region.

The embodiments shown and described above are only examples. Many details are often found in the art such as the other features of a radiation measurement panel and device. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A method, comprising:
   receiving a substrate having a first region and a second region defined thereon and an insulating structure formed there-between;
   forming a gate stack including a dielectric layer and a gate poly layer formed thereon extending across the first region and the second region;
   forming a first well mask covering the second region, wherein the first well mask defines a first opening that exposes a portion of the gate poly layer over the first region;
   performing a first doping process, through the first opening of the first well mask and through the gate stack, to form a first well in the substrate beneath the first opening; and
   performing a second doping process to the gate poly layer via the first well mask to form a first gate conductor;
   wherein the first opening defined by the first well mask is narrower than the first region in a cross section thereof; and wherein a lateral span of the first well is narrower than the first region in a cross section thereof.

2. The method of claim 1, further comprising forming a second well mask covering the first region, wherein the second well mask defines a second opening that exposes a portion of the gate poly layer over the second region; performing a third doping process, through the second opening of the second well mask and through the gate stack, to form a second well in the substrate beneath the second opening; and performing a fourth doping process to the gate poly layer via the second well mask to form a second gate conductor.

3. The method of claim 2, wherein the dopant of a first species utilized in the first doping process is identical to the dopant of a second species utilized in the second doping process; and wherein the dopant of a third species utilized in the third doping process is identical to the dopant of a fourth species utilized in the fourth doping process.

4. The method of claim 3, further comprising forming a gate patterning mask covering the first gate conductor and the second gate conductor; recessing the gate stack form a first gate feature and a second gate feature via the gate patterning mask; and performing a source and drain formation process to form a first source feature and a first drain feature at lateral sides of the first gate feature and to form a second source feature and a second drain feature at lateral sides of the second gate feature.

5. The method of claim 4, further comprising disposing a conductive layer over the first gate stack prior to the forming the gate patterning mask; wherein the gate patterning mask covers portions of the conductive layer projectively overlapping the first gate conductor and the second gate conductor.

6. The method of claim 5, further comprising disposing a liner over the first gate feature and the second gate feature; and removing horizontal portions over and between the first gate feature and the second gate feature to form a plurality pairs of spacer, wherein the pairs of the spacer respectively covers both sidewalls of the first gate feature and the second gate feature.

7. The method of claim 5, wherein, in a cross section of the substrate, the first opening defined by the first well mask is narrower than the first region; wherein, in the cross section of the substrate, a lateral span of the first well is narrower than the first region; and wherein the source and drain formation process comprises forming a first source and drain mask covering the second region while exposing the first region, performing a fifth doping process, via the first source and drain mask, to form the first source feature and the first drain feature neighboring the first well, removing the first source and drain mask, forming a second source and drain mask covering the first region while exposing the second region, and performing a sixth doping process, via the second source and drain mask, to form the second source feature and the second drain feature neighboring the second well.

* * * * *